(12) United States Patent
Kanbe et al.

(10) Patent No.: US 6,333,857 B1
(45) Date of Patent: Dec. 25, 2001

(54) PRINTING WIRING BOARD, CORE SUBSTRATE, AND METHOD FOR FABRICATING THE CORE SUBSTRATE

(75) Inventors: Rokuro Kanbe; Yukihiro Kimura; Kouki Ogawa, all of Aichi (JP)

(73) Assignee: NGK Spark Plug Co., Ltd. (JP)

( * ) Notice: Subject to any disclaimer, the term of this patent is extended or adjusted under 35 U.S.C. 154(b) by 0 days.

(21) Appl. No.: 09/556,790

(22) Filed: Apr. 25, 2000

Related U.S. Application Data

(63) Continuation-in-part of application No. 09/459,881, filed on Dec. 14, 1999, now Pat. No. 6,214,445.

(30) Foreign Application Priority Data

Dec. 25, 1998 (JP) .................................................. 10-376864
Dec. 24, 1999 (JP) .................................................. 11-366271

(51) Int. Cl.[7] .................................................. H05K 1/11
(52) U.S. Cl. ................ 361/792; 361/306.3; 361/315; 361/794; 361/795; 174/262; 174/266
(58) Field of Search .................................. 174/261, 262, 174/264, 266; 428/209; 361/792, 794, 793, 795, 302, 313, 306.3, 315

(56) References Cited

U.S. PATENT DOCUMENTS 5,590,016 * 12/1996 Fujishiro et al. .................... 361/313
5,636,099 * 6/1997 Sugawara et al. .................... 361/278

\* cited by examiner

*Primary Examiner*—Cathy Lam
(74) *Attorney, Agent, or Firm*—Larson & Taylor, PLC

(57) ABSTRACT

A printed wiring board includes a core substrate including a laminated capacitor. The laminated capacitor includes a plurality of composite dielectric layers and a plurality of metal layers stacked alternately. Three types through-hole conductors are provided which extend between the upper and lower surfaces of the core substrate. The first through-hole conductors are directly connected to first metal layers serving one electrode of the laminated capacitor, the second through-hole conductors are directly connected to second metal layers serving the other electrode of the laminated capacitor, and the third through-hole conductors are not connected to any of the first and second metal layers. The first and second through-hole conductors are used for establishing electrical connections between power supply and ground lines and an IC chip mounted on the printed wiring board. The third through-hole conductor is used as a signal line. Since the laminated capacitor is connected between the first and second through-hole conductors, noise entry is effectively prevented.

20 Claims, 22 Drawing Sheets

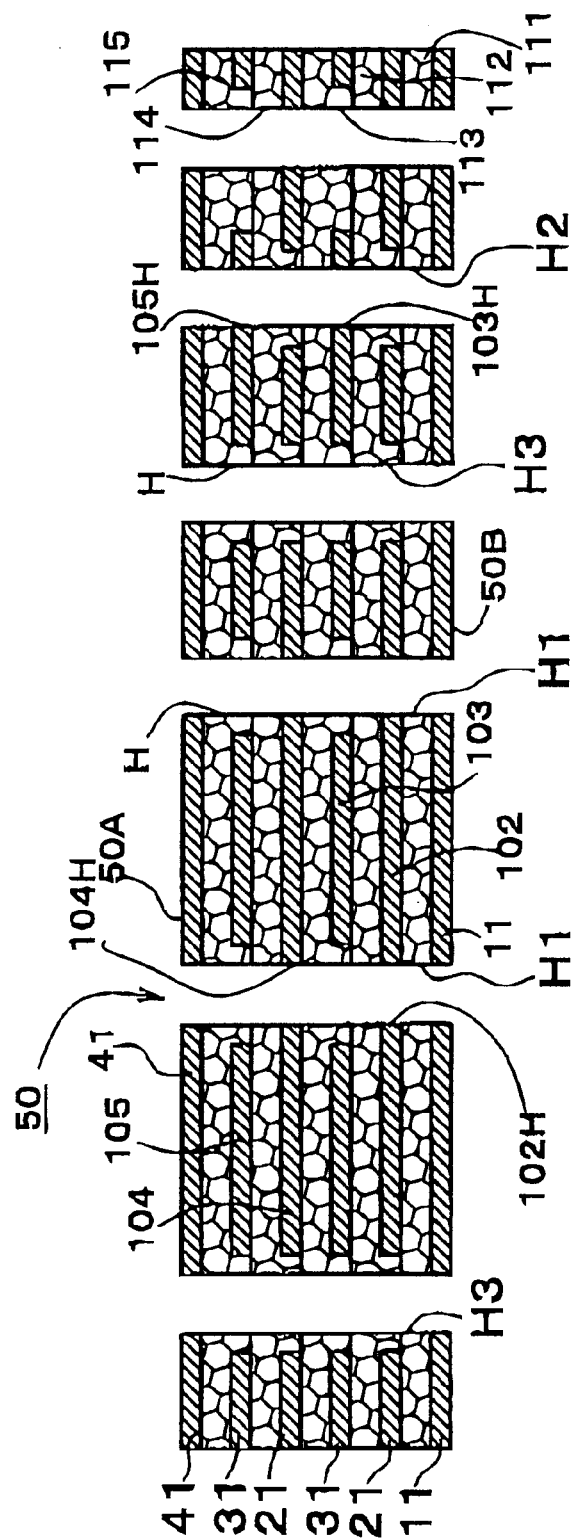

PRINTING WIRING BOARD, CORE SUBSTRATE, AND METHOD FOR FABRICATING THE CORE SUBSTRATE

RELATIONSHIP TO OTHER APPLICATIONS

This is a Continuation-In-Part of application Ser. No. 09/459,881 filed on Dec. 14, 1999 now U.S. Pat. No. 6,214,445.

BACKGROUND OF THE INVENTION

1. Field of the Invention

The present invention relates to a core substrate, to a printed wiring board having a core substrate, and insulating resin layers and wiring layers laminated on opposite sides of the core substrate, and to a method of fabricating the core substrate. More particularly, the invention relates to a printed wiring board having a capacitor incorporated therein, a core substrate used therein, and a method of fabricating the core substrate.

2. Description of the Related Art

Conventionally, a decoupling capacitor is disposed between a ground line and a power supply line for an IC chip in order to eliminate noise. For example, a chip capacitor is mounted on either side of a printed wiring board. FIG. 22 shows a printed wiring board 300 including a core substrate 310, three insulating resin layers 320, 340, and 360 formed on the front side (the upper side in FIG. 22) of the core substrate 310, three insulating resin layers 330, 350, and 370 formed on the back side (the lower side in FIG. 22) of the core substrate 310, and wiring layers 315, 325, 345, 335, and 355 sandwiched between the core substrate 310 and the insulating resin layers and between the insulating resin layers. By means of solder SL, a chip capacitor CC is mounted on the wiring layer (pads) 355 located on a back side (the lower side in FIG. 22) 300B of the printed wiring board 300. Two electrodes CCA and CCB of the chip capacitor CC are connected to the wiring layer (pads) 345 located on a front side (the upper side in FIG. 22) 300A of the printed wiring board 300 through through-hole conductors 316 and the wiring layers 315, 325, 335, and 355.

However, many manhours are required to mount such a chip capacitor on a printed wiring board and connect the same to the printed wiring board. Further, since the chip capacitor is disposed on the back side of the printed wiring board or around an IC chip, the distance between the IC chip and the chip capacitor becomes relatively large, permitting entry of noise into a circuit line extending therebetween.

In order to solve the above problem, a capacitor may be incorporated into a printed wiring board and in the vicinity of an IC chip. The capacitor may be formed within the printed wiring board while a portion of an insulating resin layer is used as a dielectric layer therefor.

When a capacitor including a thin dielectric layer sandwiched between electrode layers having a wide area is formed by an insulating resin layer and wiring layers (for example, the insulating resin layer 320 and the wiring layers 315 and 325 in the printed wiring board of FIG. 22), the capacitor is likely to suffer a short circuit, among other problems, causing a significant decrease in the yield of printed wiring boards. When the capacitor is found to be defective, the insulating resin layers and wiring layers that constitute the capacitor must be disposed of together with the core substrate, and this represents a substantial loss.

SUMMARY OF THE INVENTION

In view of the foregoing, an object of the present invention is to provide a printed wiring board that has a built-in capacitor in the vicinity of an IC chip to be mounted thereon, that can be easily fabricated at high yield, and that can minimize loss due to occurrence of a defective capacitor in the fabrication process.

Another object of the present invention is to provide a core substrate for use in the printed wiring board.

Still another object of the present invention is to provide a method for fabricating the core substrate easily and at low cost.

To achieve the above objects, the present invention provides a printed wiring board comprising a core substrate, at least one insulating resin layer laminated on each of front and back surfaces on at least one side of the core substrate, and a wiring layer formed at least between the core substrate and the insulating resin layer or between the insulating resin layers. The core substrate comprises a plurality of composite dielectric layers each containing resin and a high-permittivity powder and a plurality of metal layers stacked alternately with the composite dielectric layers such that the metal layers are disposed between the composite dielectric layers, on a lower surface of the lowermost composite dielectric layer, and on an upper surface of the uppermost composite dielectric layer so as to provide a sandwich of the composite dielectric layers forming a laminated capacitor. The core substrate further comprises a plurality of through-holes conductors each of which is formed in a through-hole extending through or penetrating the plurality of composite dielectric layers and the plurality of the metal layers, and which extends between said front and back surfaces of the core substrate. The through-hole conductors include: a plurality of first through-hole conductors directly connected to first interior metal layers which comprise first alternate interior metal layers formed between the composite dielectric layers; a plurality of second through-hole conductors directly connected to second interior metal layers which comprise second alternate interior metal layers different from the first alternate interior metal layers and unconnected to the first through-hole conductors; and a plurality of third through-hole conductors unconnected to any of the interior metal layers.

According to the printed wiring board of the present invention, the core substrate includes a laminated capacitor formed of the composite dielectric layer and the metal layers. Thus, the capacitor having a large capacitance can be disposed in the vicinity of an electronic component, such as an IC chip, thereby effectively eliminating noise. Since the laminated capacitor is incorporated in the core substrate, the core substrate may be inspected for the characteristics of, and any defect (such as a short circuit) in, the laminated capacitor. Only those core substrates that have passed the inspection may be sent to a step of fabricating printed wiring boards; in other words, insulating resin layers and wiring layers may be formed on an accepted core substrate to thereby yield a printed wiring board. Thus, printed wiring boards can be fabricated at high yield. When the built-in capacitor is found defective due to, for example, a short circuit, only the bare core substrate is disposed of, before the insulating resin layers and wiring layers are formed thereon, thereby minimizing loss. Therefore, the corresponding printed wiring boards can be fabricated at low cost.

In addition, in order to permit access to the electric potentials of metal layers serving as electrodes of the laminated capacitor not only on the front surface of the core substrate but also on the back surface of the core substrate, through-hole conductors connected electrically to selected metal layers are formed in the core substrate. Specifically, the core substrate comprises first and second through-hole conductors which connect, to the front and back surfaces of the core substrate, the electric potentials of the metal layers other than metal layers located on the front and back surfaces of the core substrate (i.e., provide an electrical connection between interior metal layers formed between the composite dielectric layers). The core substrate further comprises third through-hole conductors which are not connected to the interior metal layers.

In the printed wiring board, since the three types of through-hole conductors extend between the front and back surfaces of the core substrate, a wiring layer formed on the back surface side of the core substrate can be easily connected, by means of the through-hole conductors, to a wiring layer formed on the front surface side of the core substrate. Accordingly, when the wiring layer formed on the back surface side of the core substrate is connected to another printed wiring board, such as a motherboard, and the wiring layer formed on the front surface side of the core substrate is connected to an electronic component, such as an IC chip, the other printed wiring board and the electronic component can be connected to each other by means of the through-hole conductors.

In addition, a laminated capacitor is formed in parallel between the first and second through-hole conductors. Therefore, when a power supply line and a ground line are connected to the first and second through-hole conductors, respectively, electrical power can be supplied from the other printed wiring board, e.g., a motherboard, to the electronic component, while at the same time readily and reliably eliminating noise generated between the power supply line and the ground line.

Preferably, in order to permit access, on a surface of the core substrate, to an electrical potential of metal layers serving as electrodes of the laminated capacitor, a through-hole conductor connected electrically to selected metal layers is formed in the core substrate. In other words, the through-hole conductor is preferably electrically connected to predetermined ones of the above-mentioned plurality of metal layers other than a metal layer located on the surface of the core substrate to thereby permit access, on the surface of the core substrate, to an electrical potential of the predetermined interior metal layers. A manner of connecting the through-hole conductor and the predetermined metal layers may be determined according to other circuit lines formed on the printed wiring board such as signal circuit lines and the required type and number of power supply and ground lines.

Circuit lines extending from the metal layers of the laminated capacitor to the surface of the printed wiring board on which electronic components are mounted (i.e., the front surface) may include a stacked via. The reason for this is that the shorter and the thicker the circuit lines extending between an electronic component, such as an IC chip, and the electrodes (metal layers) of the capacitor, the lower the inductance of the circuit lines, thereby suppressing noise entry into the lines.

The resin to be contained in the composite dielectric layer may be selected in view of permittivity, heat resistance, and other properties. Examples of usable resins include epoxy resin, polyimide resin and BT resin. The high-permittivity powder to be contained in the composite dielectric layer may be of a substance having high permittivity; for example, a high-permittivity ceramic, such as $BaTiCO_3$, $PbTiO_3$, $PbZrO_3$, $Pb(Ti,Zr)O_3$ (so-called PZT), $Pb(Mn,Nb)O_3$, $SrTiO_3$, $CaTiO_3$, or $MgTiO_3$. Further, the addition of a metal powder of, for example, Ag, Au, Cu, Ag—Pd, Ni, W, or Mo, may increase the permittivity of the composite dielectric layer.

The present invention also provides a printed wiring board comprising a core substrate having front and back surfaces, at least one insulating resin layer laminated onto the front and back surfaces of the core substrate, and a wiring layer formed at least between the core substrate and the insulating resin layer or between the insulating resin layers. The core substrate comprises a center substrate having front and back surfaces, and first and second laminated capacitors formed, respectively, on the front and back surfaces of the center substrate. Each laminated capacitor comprises at least one composite dielectric layer containing resin and a high-permittivity powder, and a plurality of metal layers stacked alternately with the at least one composite dielectric layer so as to sandwich the composite dielectric layer therebetween. The core substrate further comprises a plurality of through-hole conductors each formed in a through-hole penetrating or extending through the first laminated capacitor, the center substrate, and the second laminated capacitor. The through-hole conductors extend between the front and back surfaces of the core substrate. The through-hole conductors comprise first, second and third through-hole conductors. The first through-hole conductor is directly connected to at least one metal layer selected from the plurality of metal layers of the first laminated capacitor and serving as a first electrode of the first laminated capacitor and to at least one metal layer selected from the plurality of metal layers of the second laminated capacitor. The second through-hole conductor is directly connected to at least one metal layer selected from the plurality of metal layers of the first laminated capacitor and serving as a second electrode of the first laminated capacitor and to at least one metal layer selected from the plurality of metal layers of the second laminated capacitor and serving as a second electrode of the second laminated capacitor. The third through-hole conductor is unconnected to the electrodes of the first and second laminated capacitors.

As indicated above, the printed wiring board of the present invention has a laminated capacitor formed on each of the front and back surfaces of the center substrate and thus, the capacitor can be disposed in the vicinity of an electronic component, such as an IC chip, thereby effectively eliminating noise. Because the laminated capacitor is incorporated in the core substrate, the core substrate may be inspected as to its characteristics including any defect, such as a short circuit, in the laminated capacitor. Only those core substrates that pass inspection are sent on to the fabricating operation for making corresponding printed wiring boards. Because defective core substrates are eliminated, the printed wiring boards can be fabricated with a high yield. When a laminated capacitor is found to be defective due to, for example, a short circuit, only the bare or basic core substrate itself is discarded or disposed of, i.e., the core substrate as it exists before the insulating resin layers and wiring layers are formed thereon, thereby minimizing loss. Therefore, the cost of production of the printed wiring boards can be reduced.

In addition, the electrical potentials or voltages at the metal layers serving as the electrodes of the laminated capacitors can be supplied to the front and back surfaces of the core substrate by means of the first and second through-hole conductors. Further, as noted above, a third through-hole conductor which is unconnected to the electrodes of the laminated capacitors is also provided.

In the completed printed wiring board, because the through-hole conductors extend between the front and back surfaces of the core substrate, a wiring layer formed on the back surface side of the core substrate can be easily connected, by means of the through-hole conductors, to a wiring layer formed on the front surface side of the core substrate. Accordingly, when the wiring layer formed on the back surface side of the core substrate is connected to another printed wiring board such as a motherboard, and the wiring layer formed on the front surface side of the core substrate is connected to an electronic component such as an IC chip, the other printed wiring board and the electronic component can be connected to each other via the through-hole conductors.

In addition, a laminated capacitor is formed in parallel between the first and second through-hole conductors. Therefore, when a power supply line and a ground line are connected to the first and second through-hole conductors, respectively, electrical power can be supplied from another printed wiring board, such as a motherboard, to the electronic component, while easily and reliably eliminating noise generated between the power supply line and the ground line.

Because, in the printed wiring board, a laminated capacitor is formed on the front and back surfaces of the center substrate, with proper selection of the material and thickness of the center substrate, the center substrate can provide the rigidity required by the core substrate or the printed wiring board. Therefore, the required rigidity of the printed wiring board can be easily obtained.

The material used for the center substrate is selected based on consideration of such characteristics as heat resistance, mechanical strength, flexibility, and workability, among other properties. Examples of preferred materials include a glass-fiber-resin composite material comprised of glass fiber, such as a glass fabric or nonwoven glass fabric, and resin, such as an epoxy resin, polyamide resin, or BT resin; a composite material composed of resin and an organic fiber such as polyamide fiber; and a resin-resin composite material formed through impregnation of a three-dimensional network fluorine resin, such as continuously porous PTFE, with a resin such as an epoxy resin.

When the center substrate is formed of a material containing one or more of the above-described resins, the through-holes can be formed in the center substrate, together with the laminated capacitors, by means of laser machining or drilling.

The center substrate may be formed of a metal plate made of copper, brass, nickel, aluminum, copper-invar-copper clad, or copper-molybdenum-copper clad. When one of these metals is used for the center substrate, the center substrate itself can be used as one of the electrodes of one or both of the laminated capacitors.

Further, circuit lines extending from the metal layers of the laminated capacitor to the surface (front surface) of the printed wiring board on which electronic components are mounted advantageously include a stacked via. The reason for this is that the shorter and thicker the circuit lines extending between an electronic component, such as an IC chip, and the electrodes (metal layers) of the corresponding capacitor, the lower the inductance of the circuit lines, thereby suppressing entry of noise.

The above-described printed wiring boards preferably have a structure such that a plug material is inserted or charged into each of the plurality of through-hole conductors; a block portion is provided on each of the front and back surfaces of the core substrate; and a block-portion via conductor is provided on the block portion on the front surface of the core substrate. The block-portion via conductor penetrates the resin insulating layer on the front surface of the core substrate.

Because a plug material is inserted or charged into each of the plurality of through-hole conductors, a block portion is formed, and a block-portion via conductor is formed thereon, the electrodes of the laminated capacitor can be connected to the front surface of the printed wiring board by means of the through-hole conductors over a shorter distance, i.e., with reduced resistance and inductance. Thus, noise entry can be more effectively prevented.

Further, in the above-described printed wiring boards, another via conductor is preferably stacked onto the block-portion via conductor to form or constitute a stacked via structure.

When such a stacked via structure is employed, the block-portion via conductor can be connected directly to the additional via conductor stacked thereon. Therefore, the electrodes of the laminated capacitor can be connected to the front surface of the printed wiring board by means of the through-hole conductors over a shorter distance, i.e., with further reduced resistance and inductance. Thus, noise entry can be more effectively prevented.

Preferably, among the three types of through-hole conductors only the first and second through-hole conductors are formed within an area occupied by an IC chip, and the third through-hole conductor is not formed within this area. Alternatively, the number of the third through-hole conductors formed within the area is chosen to be, or otherwise made, smaller than the total number of the first and second through-hole conductors formed within the area. The number of the third through-hole conductors formed outside the area is preferably greater than the number of the third through-hole conductors formed within the area.

As described above, it is desired to establish connection between the power supply terminal and ground terminal of an IC chip and the electrodes of the capacitor formed in the printed wiring board, as well as between the power supply terminal and ground terminal of the IC chip and a power supply line and a ground line, over the shortest possible distance in order to reduce the resistance and capacitance of the connection lines and to thereby prevent noise entry. Moreover, signal lines connected to signal terminals of the IC chip are not required to have resistance and inductance values as low as is required for the above-described connection lines.

In the printed wiring board of the present invention the third through-hole conductors used as signal lines and like lines are formed such that a larger number of the third through-hole conductors are formed outside the IC occupying area than inside the outside the IC occupying area. Stated differently, most of the third through-hole conductors are formed outside of the IC occupying area. Therefore, when the first and second through-hole conductors are formed in the IC occupying area directly under the IC chip, it is not necessary to consider the positions of the third through-hole conductors. Therefore, the first and second through-hole conductors can be disposed at the appropriate positions in order to establish connections between these conductors and the power supply and ground terminals of the IC chip which extend over a very short distance. Thus, the resistance and inductance of the connection lines between the first and second through-hole conductors and the power supply and ground terminals of the IC chip can be reduced in order to reduce noise which enters the connection lines at that portion. Further, in the printed wiring board, because the laminated capacitor is formed between the first and second through-hole conductors, noise can be reduced further.

As can be readily understood from the foregoing description, there may be employed a structure such that all the third through-hole conductors are formed outside the IC occupying area, and no third through-hole conductors are formed inside the IC occupying area, and this is a more preferred embodiment of the invention.

The present invention further provides a core substrate which is used to fabricate a printed wiring board through lamination of one or more insulating resin layers and wiring layers on each of the front and back surfaces of the core substrate. The core substrate comprises a plurality of composite dielectric layers each containing resin and a high-permittivity powder; and a plurality of metal layers stacked alternately with the composite dielectric layers such that the metal layers are disposed between the composite dielectric layers, on a lower surface of the lowermost composite dielectric layer, and on an upper surface of the uppermost composite dielectric layer, in order to sandwich the composite dielectric layer therebetween to thereby form a laminated capacitor. The core substrate further comprises a plurality of through-holes conductors each of which is formed in a through-hole penetrating or extending through the plurality of composite dielectric layers and the plurality of the metal layers and extending between the front and back surfaces of the core substrate (i.e., between the lower surface of the lowermost composite dielectric layer and the upper surface of the uppermost composite dielectric layer). The through-hole conductors include a first through-hole conductor directly connected to first interior metal layers which are alternately selected from interior metal layers formed between the composite dielectric layers; a second through-hole conductor directly connected to second interior metal layers which are selected from the interior metal layers and are not connected to the first through-hole conductor; and a third through-hole conductor unconnected to the interior metal layers. The core substrate comprises at least one composite dielectric layer that contains resin and high-permittivity powder; and a plurality of metal layers disposed to sandwich the composite dielectric layer therebetween to thereby form a laminated capacitor.

A capacitor is likely to suffer a defect, such as a short circuit. According to the present invention, the capacitor is incorporated in the core substrate, thereby enabling the laminated capacitor to be inspected for capacitance and any defect, such as a short circuit, upon completion of the core substrate. Therefore, only those core substrates that conform to predetermined criteria are used in a further step of fabricating printed wiring boards, thereby increasing the yield of printed wiring boards. When the laminated capacitor is found defective due to, for example, a short circuit or insufficient capacitance, the bare core substrate itself may simply be disposed of, before the insulating resin layers and wiring layers are formed thereon, thereby minimizing loss.

In addition, in order to permit or provide access to the electrical voltages or potentials of the metal layers serving as electrodes of the laminated capacitor not only on the front surface of the core substrate but also on the back surface of the core substrate, through-hole conductors are formed in the core substrate which are electrically connected to selected metal layers. Specifically, the core substrate comprises first and second through-hole conductors which supply, to the front and back surfaces of the core substrate, the electrical potentials of the metal layers other than metal layers located on the front and back surfaces of the core substrate (i.e., the interior metal layers formed between the composite dielectric layers). The core substrate further comprises third through-hole conductors which are unconnected to the interior metal layers.

In the core substrate, because the three types of through-hole conductors extend between the front and back surfaces of the core substrate, a wiring layer formed on the back surface side of the core substrate can be readily connected by means of the through-hole conductors, to a wiring layer formed on the front surface side of the core substrate.

In addition, a laminated capacitor is formed in parallel between the first and second through-hole conductors. Therefore, when a power supply line and a ground line are connected to the first and second through-hole conductors, respectively, electrical power can be supplied from another printed wiring board, such as a motherboard, to the electronic component, while easily and reliably eliminating noise generated between the power supply line and the ground line.

Preferably, in order to permit access, on a surface of the core substrate, to an electrical potential of metal layers serving as electrodes of the laminated capacitor, a through-hole conductor connected electrically to selected metal layers is formed in the core substrate. In other words, the through-hole conductor is preferably electrically connected to predetermined ones of the above-mentioned plurality of metal layers other than a metal layer located on the surface of the core substrate to thereby permit access, on the surface of the core substrate, to an electrical potential of the predetermined interior metal layers. A manner of connecting the through-hole conductor and the predetermined metal layers may be determined according to other circuit lines formed on the printed wiring board, such as signal circuit lines and the required type and number of power supply and ground lines.

The present invention further provides a core substrate which is used to fabricate a printed wiring board through lamination of one or more insulating resin layers and wiring layers on each of the front and back surfaces of the core substrate. The core substrate comprises a center substrate, and a laminated capacitor formed on each of the front and back surfaces of the center substrate, i.e., a first, front-side capacitor and second, back-side capacitor. Each laminated capacitor comprises at least one composite dielectric layer containing resin and a high-permittivity powder, and a plurality of metal layers stacked alternately with a respective composite dielectric layer in order to sandwich the composite dielectric layer therebetween. The core substrate further comprises a plurality of through-holes conductors each formed in a through-hole extending through or penetrating the front-side laminated capacitor, the center substrate, and the back-side laminated capacitor. The through-holes conductors also extend between front and back surfaces of the core substrate. The through-hole conductors include first, second and third through-hole conductors. The first through-hole conductor is directly connected to at least one metal layer which is selected from the plurality of metal layers of the front-side laminated capacitor and serve as a first electrode of the front-side laminated capacitor, as well as to at least one of the metal layers which is selected from the plurality of metal layers of the back-side laminated capacitor and serves as a first electrode of the back-side laminated capacitor. The second through-hole conductor is directly connected to at least one of the metal layers which is selected from the plurality of metal layers of the front-side laminated capacitor and serves as a second electrode of the front-side laminated capacitor, as well as to at least one metal layers which is selected from the plurality of metal layers of the back-side laminated capacitor and serves as a second electrode of the back-side laminated capacitor. The third through-hole conductor is unconnected to capacitor electrodes, i.e., is not connected to the electrodes of either the front-side laminated capacitor or the back-side laminated capacitor.

As indicated above, the core substrate of the present invention has a respective laminated capacitor formed on each of the front and back surfaces of the center substrate and, as a consequence, the corresponding capacitor can be disposed in the vicinity of an electronic component, such as an IC chip, thereby effectively eliminating noise. Since the laminated capacitor is incorporated in the core substrate, the core substrate can be inspected as to its characteristics including any defect, such as a short circuit, in the laminated capacitor. Only those core substrates that pass the inspection are sent on for use in fabricating printed wiring boards. Thus, printed wiring boards can be fabricated with a high yield. In this regard, when the laminated capacitor is found defective due to, for example, a short circuit, merely the basic or bare core substrate is disposed of, i.e., before the insulating resin layers and wiring layers are formed thereon, thereby minimizing loss. In addition, because the through-hole conductors extend between the front and back surfaces of the core substrate, a wiring layer formed on the back surface side of the core substrate can be easily connected by means of the through-hole conductors, to a wiring layer formed on the front surface side of the core substrate.

Preferably, the thickness of the center substrate is greater than that of the composite dielectric layer. In this case, the rigidity of the center substrate is increased, so that the center substrate can provide rigidity required by the core substrate or the printed wiring board. Thus, handling of the core substrate and the printer wiring board is facilitated.

Preferably, the composite dielectric layers and the metal layers provided on the front surface side of the center substrate and the composite dielectric layers and the metal layers provided on the back surface side of the center substrate are identical in terms of the number of layers, the material used in making the respective layers, and the thicknesses of corresponding layers.

It will be appreciated that when the front and back sides of the center substrate differ in the number of layers, the materials of the respective layers, or the thicknesses of corresponding layers, the front and back sides of the center substrate are subjected to different degree of thermal expansion, with the result that the core substrate may undergo warpage. Because, in accordance with the present invention, the layers are formed on the front and back surfaces of the center substrate such that the opposite sides are identical in terms of the number of layers, the materials of respective layers, and the thicknesses of corresponding layers, the core substrate does not undergo warpage and maintains its shape over time.

The above-described core substrates preferably have a structure such that a plug material is inserted or charged into each of the plurality of through-hole conductors and a block portion is provided on each of the front and back surfaces of the core substrate.

When the block portion is formed on either end of each through-hole conductors, another via conductor (referred to as a block portion via conductor) can be formed. When the block-portion via conductors are formed, the through-hole conductors and the via conductors can be directly connected to each other, because no wiring layer is present therebetween, so that wiring of low resistance and low inductance can be realized.

Preferably, among the three types of through-hole conductors, only the first and second through-hole conductors are formed within a center portion of the core substrate as viewed in a plan view, and, as a result, the third type of through-hole conductors is not formed within the center portion. Alternatively, the number of the third through-hole conductors formed within the center portion is chosen to be, or set, smaller than the total number of the first and second through-hole conductors formed within the center portion. The number of the third through-hole conductors formed outside the center portion is preferably greater than the number of the third through-hole conductors formed within the center portion.

When an IC chip is mounted on a printed wiring board, the IC chip is generally mounted on the center portion of the printed wiring board. As described above, it is desired to establish connection between the power supply terminal and ground terminal of an IC chip and the electrodes of the capacitors formed in the printed wiring board, as well as between the power supply terminal and ground terminal of the IC chip and a power supply line and a ground line, over the shortest possible distance, i.e., with the shortest conductive path, in order to reduce the resistance and capacitance of the connection lines and to thereby prevent noise entry. It is again noted that signal lines connected to signal terminals of the IC chip are not required to have a resistance and inductance as low as do the above-described connection lines.

In the core substrate of the present invention, the third through-hole conductors used as signal lines, and like lines, are preferably formed such that a larger number of the third through-hole conductors are formed outside the center portion than inside the outside the center portion. In other words, most of the third through-hole conductors are preferably formed outside the center portion. Therefore, when the first and second through-hole conductors are formed in the center portion directly under the IC chip, consideration as to the positions of the third through-hole conductors is not required. Therefore, the first and second through-hole conductors can be disposed at their proper positions in order to establish connections between these conductors and the power supply and ground terminals of the IC chip over a very short distance. Thus, the resistance and inductance of the connection lines between the first and second through-hole conductors and the power supply and ground terminals of the IC chip can be reduced in order to reduce noise which enters the connection lines at that portion.

The present invention still further provides a method for fabricating a core substrate comprising at least one composite dielectric layer, which contains a semi-cured resin and a high-permittivity powder, and a plurality of metal layers disposed to sandwich the composite dielectric layer to thereby form a laminated capacitor. The method comprises the steps of: forming a first three-layer film comprising, in order, a metal foil, a semi-cured composite dielectric layer, and a reinforcement film, the semi-cured composite dielectric layer containing a semi-cured resin and a high-permittivity powder; forming at least one patterned three-layer film in comprising, in order, a metal foil formed in a predetermined pattern, a semi-cured composite dielectric layer, and a reinforcement film, the semi-cured composite dielectric layer containing a semi-cured resin and a high-permittivity powder; laminating a single two-layer film obtained through removal of the reinforcement film from the first three-layer film and at least one patterned two-layer film obtained through removal of the reinforcement film from the patterned three-layer film such that the semi-cured composite dielectric layers and the patterned metal foil are arranged alternately in layers while the metal foil of the two-layer film is positioned so as to be an outermost layer, placing a metal foil on the opposite outermost semi-cured composite dielectric layer of the resultant laminar structure, and thermally pressing the laminar structure to yield a laminate; forming a plurality of through-holes in the laminate such that the through-holes extend from one side of the laminate to the other side of the laminate; and forming a through-hole conductor on walls of the through-holes and forming a metal layer on opposite sides of the laminate.

According to the method of the present invention for fabricating a core substrate, the three-layer film and the patterned three-layer film are prepared in advance. The two-layer film (obtained through removal of the reinforcement film from the first three-layer film), the patterned two-layer film (obtained through removal of the reinforcement film from the patterned three-layer film), and the metal foil are arranged in layers and thermally pressed together into a laminate. There is no need for sequentially forming composite dielectric layers and metal layers, as is required in the case of forming a conventional built up multilayer printed wiring board. Therefore, the process for fabricating the core substrate is simple and short, thereby reducing the cost of fabricating the core substrate.

The reinforcement film of the first three-layer film and that of the patterned three-layer film facilitate handling of the composite dielectric layers and the metal foils or patterned metal foils. Even when the metal foil and the semi-cured semi-cured composite dielectric layer are rendered thinner, ease of handling effected by the reinforcement film facilitates the fabrication of the core substrate. Further, the reinforcement film, which covers the semi-cured dielectric layer, prevents adhesion of dust which would otherwise result from stickiness of the semi-cured composite dielectric layer, and thus prevents the occurrence of a defect caused by such dust.

Notably, the above-mentioned step of forming the three-layer film may comprise the steps of: applying to a metal foil a green composite dielectric layer that contains a resin and a high-permittivity powder; affixing a reinforcement film to the green composite dielectric layer; and rendering the resin semi-cured through application of heat to thereby form the three-layer film. In this case, the above-mentioned step of forming the patterned three-layer film comprises an additional step of pattering the metal foil into a predetermined pattern. Since the composite dielectric paste is applied to the metal foil, the three-layer film or the laminate enjoys good adhesion between the (patterned) metal foil and the composite dielectric layer, and hardly any air or dust enters therebetween, thereby preventing occurrence of a defect such as would otherwise result from trapped air or dust.

An adhesive may be employed for lamination. Specifically, the above-described step for forming the laminate may comprise the steps of: arranging the semi-cured composite dielectric layers and the patterned metal foils alternately in layers while a adhesive layer is sandwiched therebetween and the metal foil of the two-layer film is positioned so as to be an outermost layer; placing a metal foil on the opposite outermost semi-cured composite dielectric layer of the resultant laminar structure while an adhesive layer is sandwiched therebetween, and thermally pressing the laminar structure to yield the laminate. The resultant laminate enjoys reliable adhesion between the composite dielectric layers and the metal foils. It is noted that a laminate which does not employ the adhesive layers provides a larger capacitance in the laminated capacitor than a laminate which employs the adhesive layers.

In the above-described method, the through-hole forming step is preferably performed such that first, second, and third through-holes are formed. Among the patterned metal foils, alternately selected first patterned metal foils are exposed to the inner circumference of the first through-hole; unselected second patterned metal foils are exposed to the inner circumference of the second through-hole; and neither the first patterned metal foils nor the second patterned metal foils are exposed to the inner circumference of the third through-hole.

When the three-types of through-hole conductors are formed, each first patterned metal foil and a corresponding second patterned metal foil face each other and provide sandwiching of a corresponding composite dielectric layer, so that stacked laminated capacitors can be easily formed.

The present invention still further provides a core substrate which is used to fabricate a printed wiring board through lamination of one or more insulating resin layers and wiring layers on at least one side of the core substrate. The core substrate comprises a center substrate; at least one composite dielectric layer that contains resin and a high-permittivity powder; and a plurality of metal layers disposed to sandwich the composite dielectric layer to thereby form a laminated capacitor on at least one side of the center substrate.

The core substrate of the present invention has the laminated capacitor formed on at least one side of the center substrate. Thus, the capacitor can be disposed in the vicinity of an electronic component, such as an IC chip, thereby effectively eliminating noise. Since the laminated capacitor is incorporated in the core substrate, the core substrate may be inspected for the characteristics of, and any defect, such as a short circuit, in, the laminated capacitor. Only those core substrates that have passed the inspection are sent to a step of fabricating printed wiring boards. Thus, printed wiring boards can be fabricated at high yield. When the laminated capacitor is found defective due to, for example, a short circuit, only the bare core substrate need be disposed of, and this occurs before the insulating resin layers and wiring layers are formed thereon, thereby minimizing loss.

Preferably, in order to permit access, on a surface of the core substrate, to an electrical potential of metal layers serving as electrodes of the laminated capacitor, a through-hole conductor connected electrically to the metal layers is formed in the core substrate. A manner of connecting the through-hole conductor and the metal layers may be determined according to other circuit lines formed on the printed wiring board such as signal circuit lines and the required type and number of power supply and ground lines.

Material for the center substrate may be selected in consideration of heat resistance, mechanical strength, flexibility, and workability, among other properties. Examples of the material include a glass-fiber-resin composite material composed of glass fiber, such as glass fabric or unwoven glass fabric, and resin, such as epoxy resin, polyimide resin, or BT resin; a composite material composed of resin and organic fiber such as polyamide fiber; and a resin-resin composite material formed through impregnation of a three-dimensional network fluorine resin, such as continuously porous PTFE, with resin, such as epoxy resin.

The present invention still further provides a method for fabricating a core substrate comprising a center substrate, a composite dielectric layer that contains resin and a high-permittivity powder, and a plurality of metal layers disposed to sandwich the composite dielectric layer to thereby form a laminated capacitor on at least one side of the center substrate. The method comprises the steps of: forming a first three-layer film comprising, in order, a metal foil, a semi-cured composite dielectric layer, and a reinforcement film, the semi-cured composite dielectric layer containing a semi-cured resin and a high-permittivity powder; placing a two-layer film obtained through removal of the reinforcement film from the three-layer film on a center substrate having a metal layer of a predetermined pattern on at least one side thereof such that the semi-cured composite dielectric layer of the two-layer film is layered on the metal layer of the center substrate, and thermally pressing a resultant laminar structure to yield a laminate; forming a plurality of through-holes in the laminate such that the through-holes extend from one side of the laminate to the other side of the laminate; and forming a through-hole conductor on walls of the through-holes and forming a metal layer on opposite sides of the laminate.

According to the method of the present invention for fabricating a core substrate, the first three-layer film is prepared in advance. The two-layer film obtained through removal of the reinforcement film from the three-layer film is placed on at least one side of the center substrate in layers. The resultant laminar structure is thermally pressed into a laminate. There is no need for sequentially forming composite dielectric layers and metal layers on one side of the center substrate, as is required in the case of forming a built up multilayer printed wiring board. Therefore, the process for fabricating the core substrate is simplified and short in duration, thereby reducing the cost of fabricating the core substrate.

The reinforcement film of the three-layer film facilitates handling of the composite dielectric layer and the metal foil. Even when the metal foil and the (semi-cured) composite dielectric layer are rendered thinner, ease of handling effected by the reinforcement film facilitates the fabrication of the core substrate. The reinforcement film, which covers the semi-cured dielectric, prevents adhesion of dust which would otherwise result from stickiness of the semi-cured composite dielectric layer, and thus prevents the occurrence of any defect caused by such dust.

Notably, the above-mentioned step of forming the three-layer film may comprise the steps of: applying to a metal foil a green composite dielectric layer that contains a resin and a high-permittivity powder; affixing a reinforcement film to the green composite dielectric layer; and rendering the resin semi-cured through application of heat to thereby form the three-layer film. Since the composite dielectric paste is applied to the metal foil, the three-layer film or the laminate enjoys good adhesion between the metal foil and the composite dielectric layer, and substantially no air or dust enters therebetween to thereby prevent occurrence of defects such as would otherwise result from trapped air or dust.

The present invention still further provides a method for fabricating a core substrate comprising a center substrate, a composite dielectric layer that contains resin and a high-permittivity powder, and a plurality of metal layers disposed to sandwich the composite dielectric layer therebetween to thereby form a laminated capacitor on at least one side of the center substrate. The method comprises the steps of: forming a three-layer film comprising, in order, a metal foil, a semi-cured composite dielectric layer, and a reinforcement film, the semi-cured composite dielectric layer containing a semi-cured resin and a high-permittivity powder; forming at least one patterned three-layer film in which a metal foil formed in a predetermined pattern, a semi-cured composite dielectric layer, and a reinforcement film are layered in this order, the semi-cured composite dielectric layer containing a semi-cured resin and a high-permittivity powder; placing at least one patterned two-layer film obtained through removal of the reinforcement film from the patterned three-layer film on a center substrate having a metal layer of a predetermined pattern on at least one side thereof such that the semi-cured composite dielectric layer of the patterned two-layer film is superposed on the metal layer or the patterned metal foil, placing on an outermost patterned metal foil a single two-layer film obtained through removal of the reinforcement film from the first three-layer film such that the semi-cured composite dielectric layer of the two-layer film is superposed on the outermost patterned metal foil, and thermally pressing the resultant laminar structure to yield a laminate; forming a plurality of through-holes in the laminate such that the through-holes extend from one side of the laminate to the other side of the laminate; and forming a through-hole conductor on walls of the through-holes and forming a metal layer on the opposite sides of the laminate.

According to the method of the present invention for fabricating a core substrate, the three-layer film and the patterned three-layer film are prepared in advance. The patterned two-layer film (obtained through removal of the reinforcement film from the patterned three-layer film) and the two-layer film (obtained through removal of the reinforcement film from the three-layer film) are placed on at least one side of the center substrate, in layers. The resultant laminar structure is thermally pressed into a laminate. There is no need for sequentially forming composite dielectric layers and metal layers on one side of the center substrate, as is required in the case of forming a buildup multilayer printed wiring board. Therefore, the process for fabricating the core substrate becomes simple and short, thereby fabricating the core substrate at low cost. Through employment of lamination of the two-film layer and the patterned two-film layers, the resultant laminated capacitor enjoys a large capacitance.

The reinforcement film of the first three-layer film and that of the patterned three-layer film facilitate handling of the composite dielectric layers and the (patterned) metal foils. Even when the metal foil and the (semi-cured) composite dielectric layer are rendered thinner, ease of handling effected by the reinforcement film facilitates the fabrication of the core substrate. The reinforcement film, which covers the semi-cured dielectric layer, prevents adhesion of dust which would otherwise result from stickiness of the semi-cured composite dielectric layer, and thus preventing occurrence of defects caused by such dust.

BRIEF DESCRIPTION OF THE DRAWINGS

Various other objects, features and many of the attendant advantages of the present invention will be readily appreciated as the same become better understood by reference to the following detailed description of the preferred embodiments when considered in connection with the accompanying drawings, in which:

FIG. 3A to FIG. 8 are sectional views showing a method of fabricating the core substrate and the printed wiring board according to the first embodiment, wherein FIG. 3A shows the step of forming a composite dielectric layer on a copper foil;

FIG. 6 shows the step of forming through-holes in the laminate shown in FIG. 5B;

FIG. 7 shows the step of filling through-holes formed in the through-hole conductors of the core substrate shown in FIG. 1 with resin and forming conductors at the upper and lower ends of the through-holes to thereby close the through-holes; and FIG. 8 shows the steps of forming insulating resin layers and wiring layers on the upper and lower sides of the core substrate shown in FIG. 7;

FIG. 17A to FIG. 20 are sectional views showing a method of fabricating the core substrate and the printed wiring board according to the second embodiment; wherein FIG. 17A shows the step of placing two-layer films, obtained through removal of reinforcement films from the three-layer films, on opposite sides of the center substrate shown in FIG. 16;

FIG. 17B shows the step of pressing the laminar structure shown in FIG. 17A to obtain a laminate;

FIG. 18 shows the step of forming through-holes in the laminate shown in FIG. 17B;

FIG. 19 shows the step of filling through-holes formed in the through-hole conductors of the core substrate shown in FIG. 14 with resin and forming conductors at the upper and lower ends of the through-holes to thereby close the through-holes; and FIG. 20 shows the steps of forming insulating resin layers and wiring layers on the upper and lower sides of the core substrate shown in FIG. 19;

DESCRIPTION OF THE PREFERRED EMBODIMENTS

First Embodiment

Figure 1:
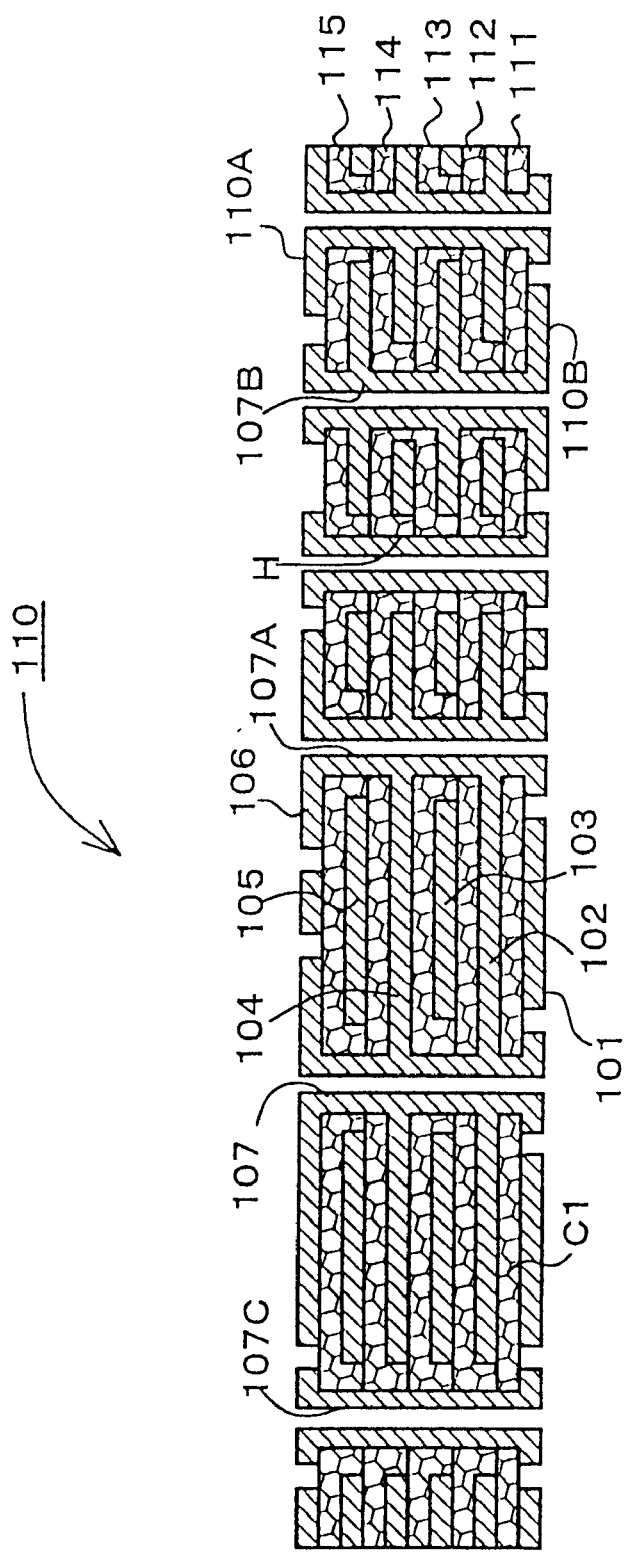
FIG. 1 is a partially enlarged sectional view showing a core substrate according to a first embodiment of the present invention.

A first embodiment of the present invention will next be described in detail with reference to the drawings. A core substrate 110 shown in FIG. 1 includes five composite dielectric layers 111–115, metal layers 101–106 of Cu, and through-hole conductors 107 of Cu. The composite dielectric layers 111–115 and the metal layers 101–106 are stacked alternately such that the metal layers 101–106 are disposed between the composite dielectric layers 111–115, on the lower surface (in FIG. 1) of the composite dielectric layer 111, and on the upper surface (in FIG. 1) of the composite dielectric layer 115. The through-hole conductors 107 are each formed on the wall of a through-hole H. The composite dielectric layers 111–115 and the metal layers 101–106 constitute a laminated capacitor C1 having 5 dielectric layers. Among the interior metal layers 102–105, those having a common electric potential (for example, the metal layers 103 and 105 or the metal layers 102 and 104) are electrically connected to the metal layer 106 on a front surface 110A of the core substrate 110 or the metal layer 101 on a back surface 110B of the core substrate 110 by means of a first through-hole conductor 107A (layer 106) or a second through-hole conductor 107B (layer 101). In other words, among the interior metal layers, alternately selected first interior metal layers 102 and 104 are connected directly to the first through-hole conductor 107A, and the unselected second interior metal layers 103 and 105 are connected directly to the second through-hole conductor 107B. The exterior metal layers 101 and 106 serve as electrodes of the laminated capacitor C1 and as wiring layers.

A certain through-hole conductor 107, such as a third through-hole conductor 107C, is not electrically connected to the interior metal layers 102–105 so as to be used as, for example, a signal circuit line. As described above, electrical continuity is established between the metal layers 102 and 104 and the metal layer 106 and between the metal layers 103 and 105 and the metal layer 101. Accordingly, through alternating arrangement of metal layers (101–106) and composite dielectric layers (111–115), the laminated capacitor C1 is implemented.

Since the three types of through-hole conductors 107A, 107B and 107C extend between the front surface 110A and the back surface 110B of the core substrate 110, a wiring layer formed on the back surface 110B of the core substrate 110 can be connected to a wiring layer formed on the front surface 110A of the core substrate 110 by means of these through-hole conductors 107.

For example, when the first through-hole conductor 107A is connected to a power supply line and the second through-hole conductor 107B is connected to a ground line, a laminated capacitor C1 is connected in parallel between the power supply line and the ground line, so that noise appearing on these lines can be absorbed. Since a signal line is connected to the third through-hole conductor 107C, the signal can be passed through the core substrate 110, while being isolated from the layered capacitor C1.

The composite dielectric layers 111–115 each have a thickness of 50 μm and are made of a ceramic-metal-resin composite material. The composite material is prepared through dispersion of 30 vol % $BaTiO_3$ and 20 vol % Cu powder into epoxy resin. Containing $BaTiO_3$ having high permittivity (relative permittivity $\epsilon_r$=approx. 18000) and Cu powder, the composite material exhibits higher permittivity ($\epsilon_r$=30) than does a conventional resin. Accordingly, the laminated capacitor C1 incorporated in the core substrate 110 assumes a relatively large capacitance (3.0 nF).

Next, a printed wiring board 100 will be described. The printed wiring board 100 shown in FIG. 2 includes the core substrate 110; three insulating resin layers 121, 141, and 161 and two wiring layers 125 and 145 formed on the front surface 110A of the core substrate 110; and three insulating resin layers 131, 151, and 171 and two wiring layers 135 and 155 formed on the back surface 110B of the core substrate 110. The wiring layers 125, 145, 135, and 155 are disposed between the insulating resin layers 121, 141, 161, 131, 151, and 171 and include via conductors 125V, 145V, 135V, and 155V, respectively, adapted to establish electrical connection to the corresponding metal layers or wiring layers located underneath. The through-hole conductors 107 formed in the core substrate 110 are filled with a plug material 116 of epoxy resin and are closed by means of block portions 101C and 106C formed on the metal layers 101 and 106, respectively.

As easily understood from the above description, the printed wiring board 100 integrally contains the laminated capacitor C1 formed in the core substrate 110. Accordingly, an IC chip (not shown) mounted on the front surface (component side) 100A of the printed wiring board 100 is located in the vicinity of the laminated capacitor C1, whereby a connecting circuit line for connecting the IC chip and the laminated capacitor C1 becomes very short, thereby reliably eliminating noise. Among the wiring layers 125, 145, 135, and 155, signal circuit lines can have a conventional circuit line width and can be routed in a conventional manner in contrast to the case where high permittivity is imparted to the insulating resin layers 121, 141, 161, 131, 151, and 171. Since the insulating resin layers 121, 141, 161, 131, 151, and 171 can be formed of a conventional epoxy resin, their permittivity remain unchanged, and thus the impedance of signal circuit lines remains unchanged. Accordingly, wiring layers including signal wiring layers can be easily designed.

Further, the block portions 101C and 106C are formed, and block-portion via conductors 125V1 and 135V1 are formed above block portions 101C and 106C such that the block-portion via conductors 125V1 and 135V1 come into direct contact with the block portions 101C and 106C. By virtue of this construction, the through-hole conductors 107 and the block-portion via conductors 125V1 and 135V1 can be connected with each other over a very short distance, so that the resistances and inductances of the wiring layer 125, etc. can be reduced. Therefore, the above-described structure is particularly effective in shortening the length of the wiring between the laminated capacitor C1 and an IC chip and thereby reducing the resistance and inductance of the wiring in order to prevent noise entry.

Figure 3A:
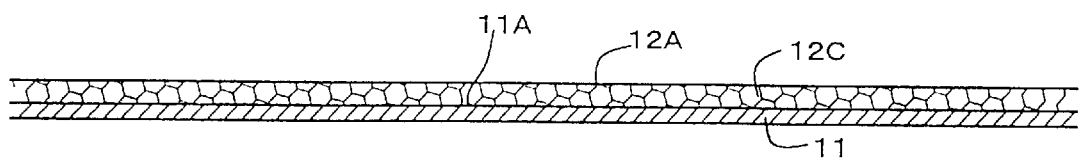

Next, the method for fabricating the core substrate 110 will be described. First, a step of forming a three-layer film will be described. A composite dielectric paste is prepared through dispersion of $BaTiO_3$ powder and Cu powder into an epoxy paste. As shown in FIG. 3A, the composite dielectric paste is applied to an upper surface 11A of a copper foil 11 having a thickness of 18 µm so as to form a paste layer having a thickness of 10–100 µm (about 60 µm in the present embodiment), yielding a green composite dielectric layer 12C. Subsequently, the green composite dielectric layer 12C is dried at a temperature of 50° C. for 60 minutes in order to increase viscosity while surface stickiness is maintained.

Next, a reinforcement film RF made of polyimide or polyester and having a thickness of 200 µm is affixed to a surface 12A of the green composite dielectric layer 12C. The resulting layered film is heated at a temperature of 80° C. for 60 minutes, thereby yielding a three-layer film 10 having the copper foil 11, a semi-cured composite dielectric layer 12, and the reinforcement film RF arranged in layers in this order. Since the three-layer film 10 is reinforced by means of the reinforcement film RF, even when the copper foil 11, a patterned copper foil 21 or 31 (described later), and the semi-cured composite dielectric layer 12 are thin, the three-layer film 10 has sufficient rigidity to endure handling during fabrication of the core substrate 110 shown in FIG. 1 having thin metal layers 101, etc., and composite dielectric layers 111, etc. Since the semi-cured composite dielectric layer 12 having some stickiness is sandwiched between the copper foil 11 and the reinforcement film RF, adhesion of dust to the semi-cured composite dielectric layer 12 is prevented. Further, since the composite dielectric paste is applied to the copper foil 11 to thereby form the green composite dielectric layer 12C, no air or dust is caught between the copper foil 11 and the semi-cured composite dielectric layer 12, thereby establishing good adhesion therebetween. Preferably, the upper surface 11A of the copper foil 11 is roughened previously through, for example, black oxide treatment, acicular plating, or etching in order to further improve adhesion between the copper foil 11 and the semi-cured composite dielectric layer 12.

Figure 4A:
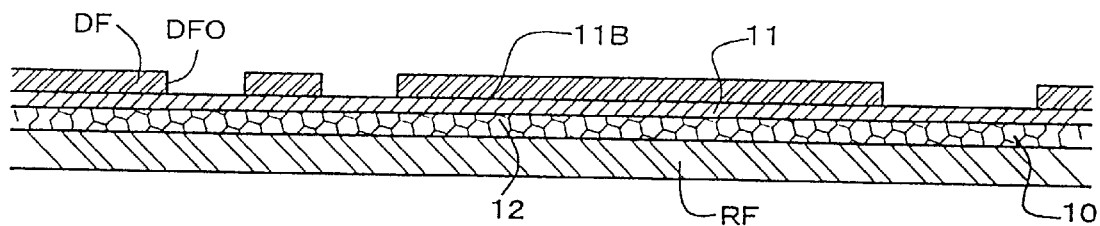
FIG. 4A shows the step of etching resist of a predetermined pattern is formed on the copper foil.
Figure 4B:
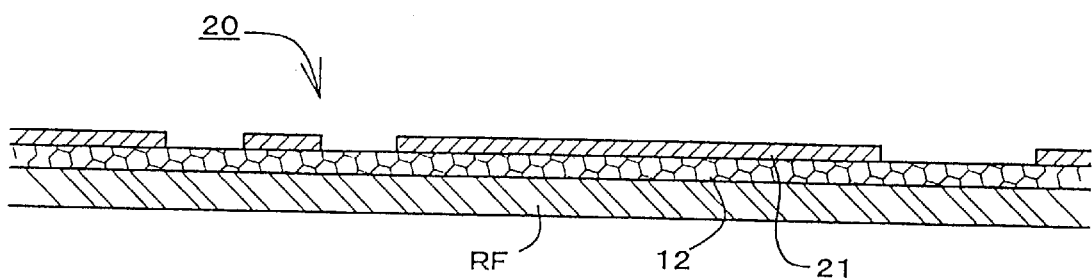
FIG. 4B shows the step of etching the copper foil into a predetermined pattern.
Figure 4C:
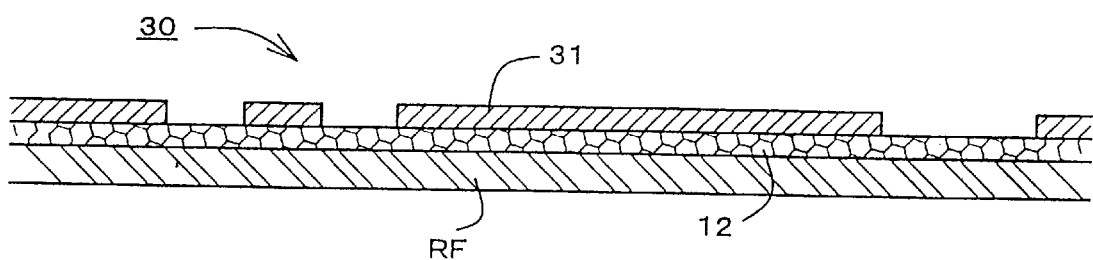
FIG. 4C shows the step of etching the copper foil into a predetermined pattern different from that of FIG. 4B.

Next, a step of forming a patterned three-layer film will be described. As shown in FIG. 4A, a dry film DF is affixed to an exposed surface 11B (upper surface in FIG. 4A) of the copper foil 11 of the three-layer film 10, followed by exposure and development to thereby form an opening DFO of a predetermined pattern. Then, as shown in FIG. 4B, the copper foil 11 is etched into a first patterned copper foil 21 of a predetermined pattern. The dry film DF is removed from the first patterned copper foil 21, yielding a first patterned three-layer film 20. Similarly, as shown in FIG. 4C, a second patterned three-layer film having a second patterned copper foil 31 is formed. Preferably, the exposed surface of the patterned copper foil 21 (31) is roughened through, for example, black oxide treatment, acicular plating, or etching, thereby improving adhesion between the patterned copper foil 21 (31) and the adjacent semi-cured composite dielectric layer 12 in the subsequent lamination step.

Figure 3B:
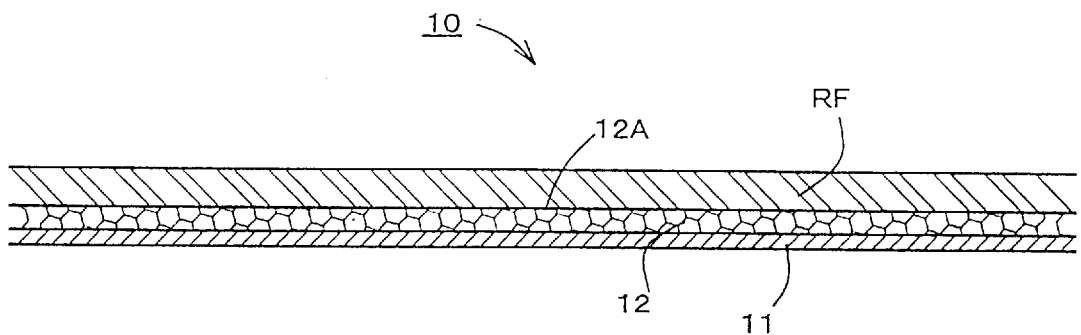
FIG. 3B shows the step of affixing a reinforcement film to the composite dielectric layer to complete a three-layer film.
Figure 5A:
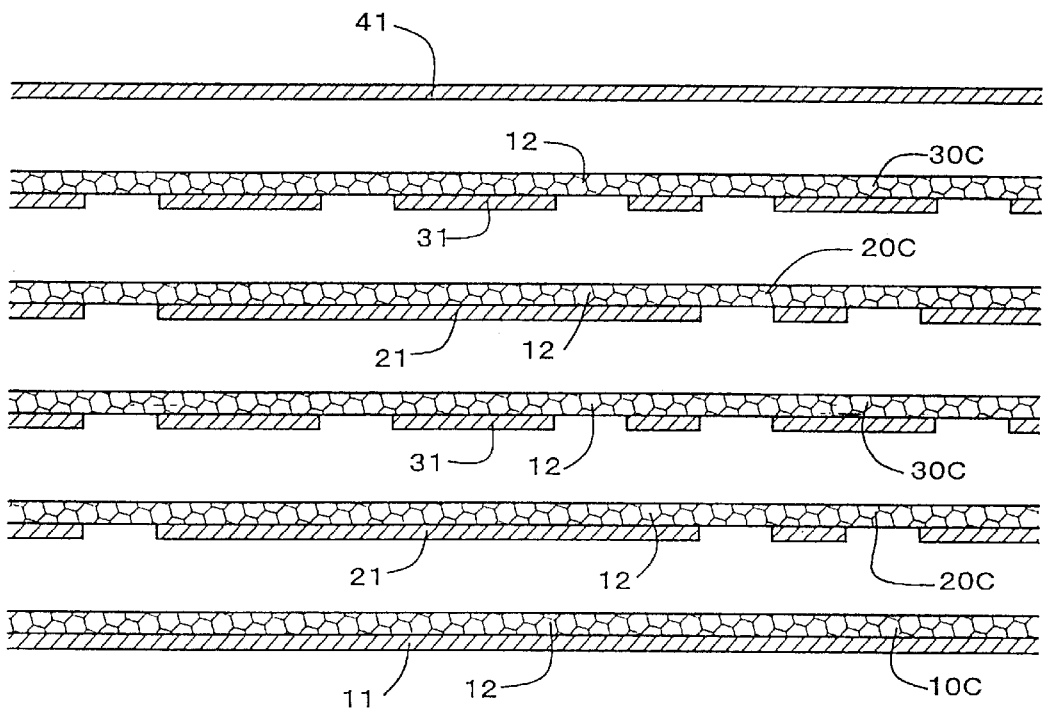
FIG. 5A shows the step of stacking two-layer films, obtained through removal of reinforcement films from the three-layer films shown in FIGS. 3B, 4B, and 4C.
Figure 5B:
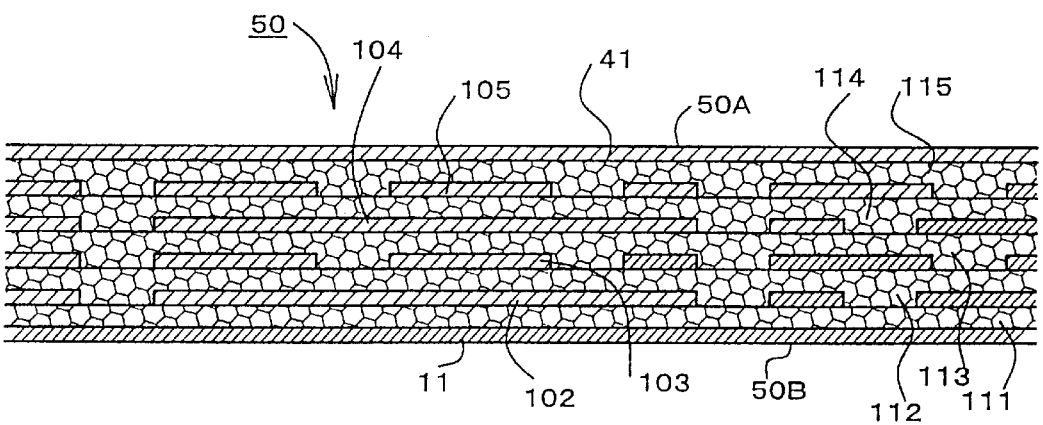
FIG. 5B shows the step of pressing the laminar structure of FIG. 5A to obtain a laminate.

In the subsequent lamination step, as shown in FIG. 5A, a two-layer film 10C obtained through removal of the reinforcement film RF from the three-layer film 10 shown in FIG. 3B and the first and second patterned three-layer films 20C and 30C obtained through removal of the reinforcement films RF from the first and second patterned three-layer films 20 and 30, respectively, are arranged in layers in this order while the copper foil 11 of the two-layer film 10C becomes a bottom layer. In other words, the semi-cured composite dielectric layer 12 and the patterned copper foils 21 and 31 are arranged in an alternating manner in layers. In the present embodiment, the two first patterned two-layer films 20C and the two second patterned two-layer films 30C are arranged alternatingly in layers. A copper foil 41 having a thickness of 18 µm is placed on the top semi-cured composite dielectric layer 12. The resultant laminar structure is thermally pressed in the vertical direction of FIG. 5A in a vacuum at a temperature of 180° C. and a pressure of 30 kg/cm² for 2 hours so as to cure epoxy resin of the composite dielectric layers 12, thereby yielding a laminate 50 shown in FIG. 5B. In the laminate 50, the five composite dielectric layers 111–115 and the metal layers 102–105 patterned as designed are arranged alternatingly in layers and the copper foils 11 and 41 form a front surface 50A and a back surface 50B, respectively.

In the subsequent step of forming through-holes, as shown in FIG. 6, through-holes H having a diameter of 60 $\mu$m are formed in the laminate 50 at predetermined positions in such a manner as to extend between the front surface 50A and the back surface 50B, by use of a fourth harmonic of a YAG laser. End faces 102H and 104H of the metal layers 102 and 104 or end faces 103H and 105H of the metal layers 103 and 105 are exposed on the walls of some through-holes H. In other words, three kinds of through-holes, viz. a first through-hole H1, a second through-hole H2, and a third through-hole H3, are formed. Among the patterned metal foils 21 and 31, which will become the interior metal layers 102 to 105, alternately selected first patterned metal foils 21 are exposed to the inner circumference of the first through-hole H1; unselected second patterned metal foils 31 are exposed to the inner circumference of the second through-hole H2; and neither the first patterned metal foils 21 nor the second patterned metal foils 31 are exposed to the inner circumference of the third through-hole H3. The through-holes H may be formed by means of a third harmonic of a YAG laser, $CO_2$ laser, or drilling, depending on, for example, a through-hole diameter and materials for the laminate.

In the step of forming a metal layer on the front and back surfaces 50A and 50B of the laminate 50, the through-hole conductors 107 are formed on the corresponding walls of the through-holes H by a known PTH process. Also, through utilization of the copper foils 11 and 41, the metal layers 101 and 106 having predetermined patterns are formed, thus completing the core substrate 110 (see FIG. 1). Notably, among the through-hole conductors 107, for example, the first and second through-hole conductors 107A and 107B are electrically connected to the end faces 102H and 104H of the metal layers 102 and 104 and the end faces 103H and 105H of the metal layers 103 and 105, respectively. Thus, as mentioned previously, electrical continuity is established between the metal layers 102 and 104 serving as opposite electrodes of the laminated capacitor C1 and the metal layers 106 and 101 formed on the front and back surfaces 110A and 110B, respectively, via the first and second through-hole conductors 107A and 107B.

The core substrate 110 is inspected for a short circuit in, and the insulation resistance of, or capacitance of, the laminated capacitor C1. For example, when the laminated capacitor C1 suffers a short circuit caused by a short circuit between the metal layers 102 and 103 or fails to exhibit a capacitance falling within a predetermined range, the core substrate 110 is disposed of as a defective core substrate. The larger the capacitance of a capacitor, the more noise elimination capability improves. Accordingly, a higher capacitance is preferred. Conceivable measures to increase the capacitance include the following: the thickness of the composite dielectric layers 111–115 is reduced; the area of the core substrate 110 (specifically, the area of the metal layers) is increased; and the metal powder (such as copper powder) content of the composite dielectric layers 111–115 is increased in order to increase the permittivity of the composite dielectric layers 111–115.

However, these measures are likely to cause a short circuit in the laminated capacitor C1, potentially resulting in a reduced yield of the core substrates 110. The present embodiment enables the core substrate 110 to be readily checked for conditions of the laminated capacitor C1. If the laminated capacitor C1 is found defective, the bare core substrate 110 can be disposed of before the insulating resin layers and wiring layers are formed thereon. Therefore, the printed wiring board 100 in process of or after fabrication is less likely to suffer a defective laminated capacitor C1, so that the fabrication of the printed wiring boards 100, which will be described later, is less likely to suffer a reduction in yield caused by occurrence of a defective laminated capacitor C1 and a loss caused by disposal of the printed wiring boards 100 having a defective laminated capacitor C1.

Figure 7:
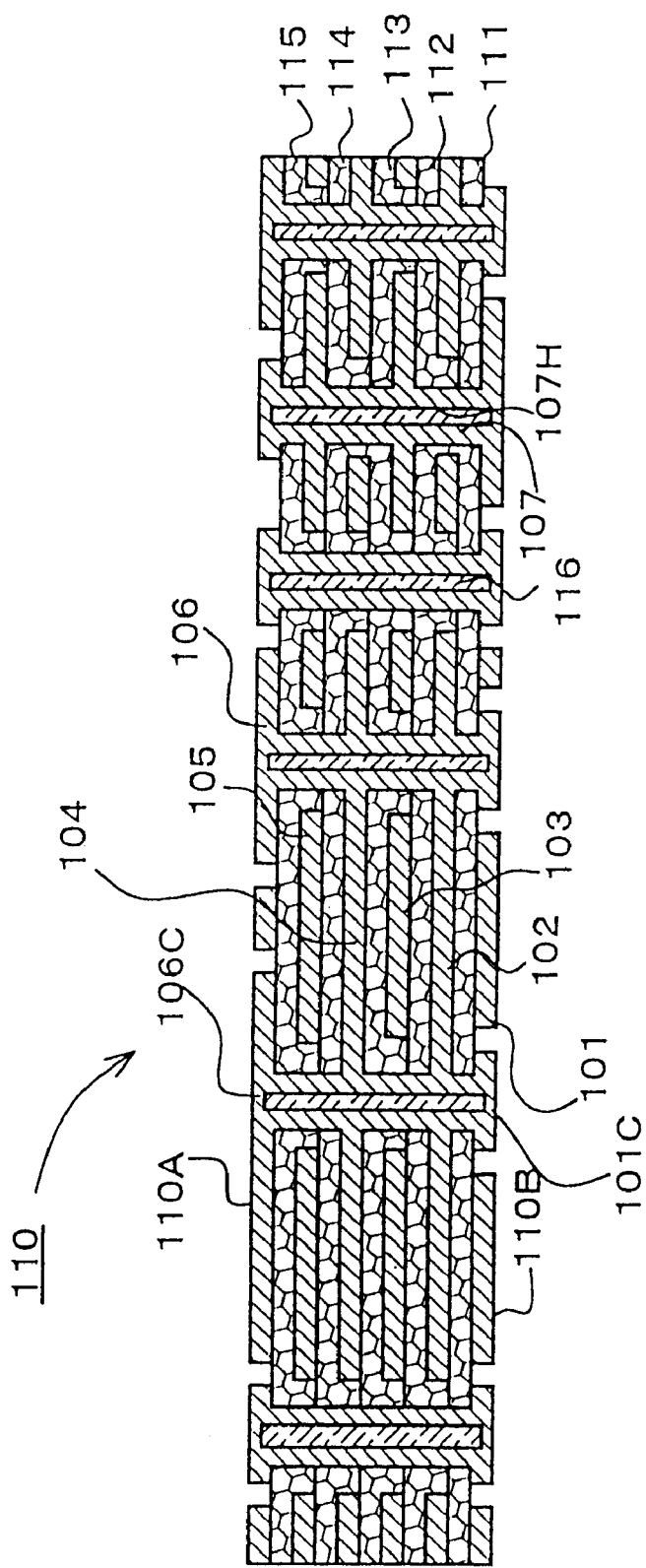

The core substrate 110 may be formed into the printed wiring board 100 by a known process. Specifically, as shown in FIG. 7, through-holes 107H formed in the corresponding through-hole conductors 107 are filled with the plug material 116 of epoxy resin and are closed by the block portions 101C and 106C, which are formed by plating.

Figure 8:
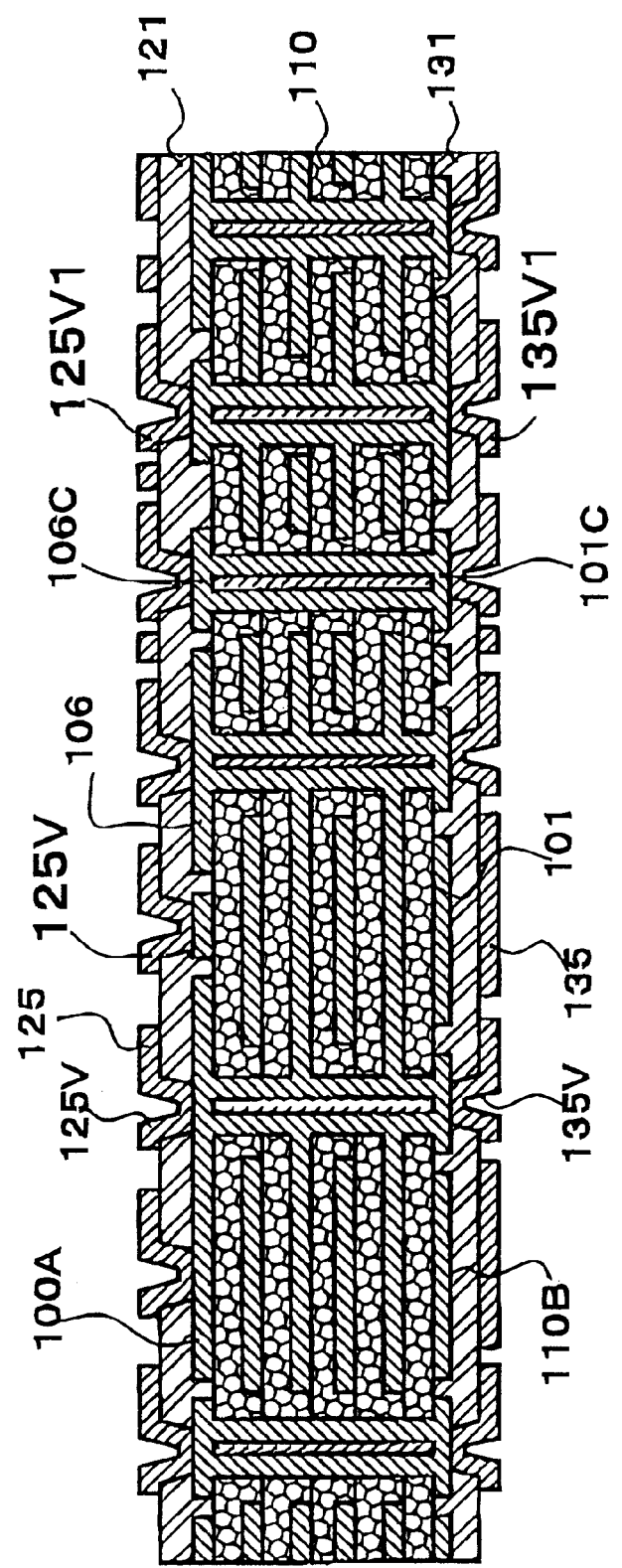

Next, a photosensitive epoxy resin film is affixed to the front and back surfaces 110A and 110B of the core substrate 110, followed by exposure and development to thereby form via holes in the films. Subsequently, the films are cured to become the insulating resin layers 121 and 131. Further, the wiring layers 125 and 135 of copper including the via conductors 125V and 135V, respectively, are formed by a semi-additive process (see FIG. 8).

Similarly, the insulating resin layers 141 and 151 and the wiring layers 145 and 155 including the via conductors 145V and 155V, respectively, are formed, followed by formation of the insulating resin layers 161 and 171 serving as solder resist. Thus is completed the printed wiring board 100 (see FIG. 2).

As described above, the present embodiment uses the three-layer film 10 and the patterned three-layer films 20 and 30 in fabrication of the laminate 50. There is no need for sequentially forming the composite dielectric layers 111–115 and the metal layers 101–106. Specifically, through use of the three-layer films 10 and the patterned three-layer films 20 and 30 to make up a required number of layers, a laminate can be formed at a time, thereby facilitating the fabrication of the core substrate 110. When the insulating resin layers 121 and the wiring layers 125 are to be formed on the front and back surfaces 110A and 110B of the core substrate 110, the core substrate 110 permits the use of conventional facilities and steps employed for the fabrication of a printed wiring board from a conventional core substrate even though the core substrate 110 has the laminated capacitor C1 incorporated therein. Thus, the printed wiring board 100 can be easily fabricated while the laminated capacitor C1 is incorporated therein.

A Modification of the First Embodiment

A core substrate 510 and a printed wiring board 500 according to a modification of the first embodiment will now be described with reference to the drawings. The core substrate 510 and the printed wiring board 500 according to this modification are formed of materials similar to those of the core substrate 110 and the printed wiring board 100 according to the first embodiment and have structures similar thereto. However, whereas the printed wiring board 100 employs a staggered via structure such that the via conductor 145 is formed at a position horizontally offset from the via conductor 125V, the printed wiring board 500 according to this modification, i.e., the modified embodiment now being described, employs a stacked via structure such that via conductors are stacked in the thickness direction of the via conductors. Further, the printed wiring board 500 according to this modification is characterized by the planar layout of three types of through-hole conductors 507A, 507B, and 507C. Therefore, because of the similarities between this modification and the basic or first embodiment, only those aspects of the modified embodiment which differ from those of the first embodiment will, in general, be described, and the description of corresponding or similar aspects will be omitted or simplified.

Figure 9:
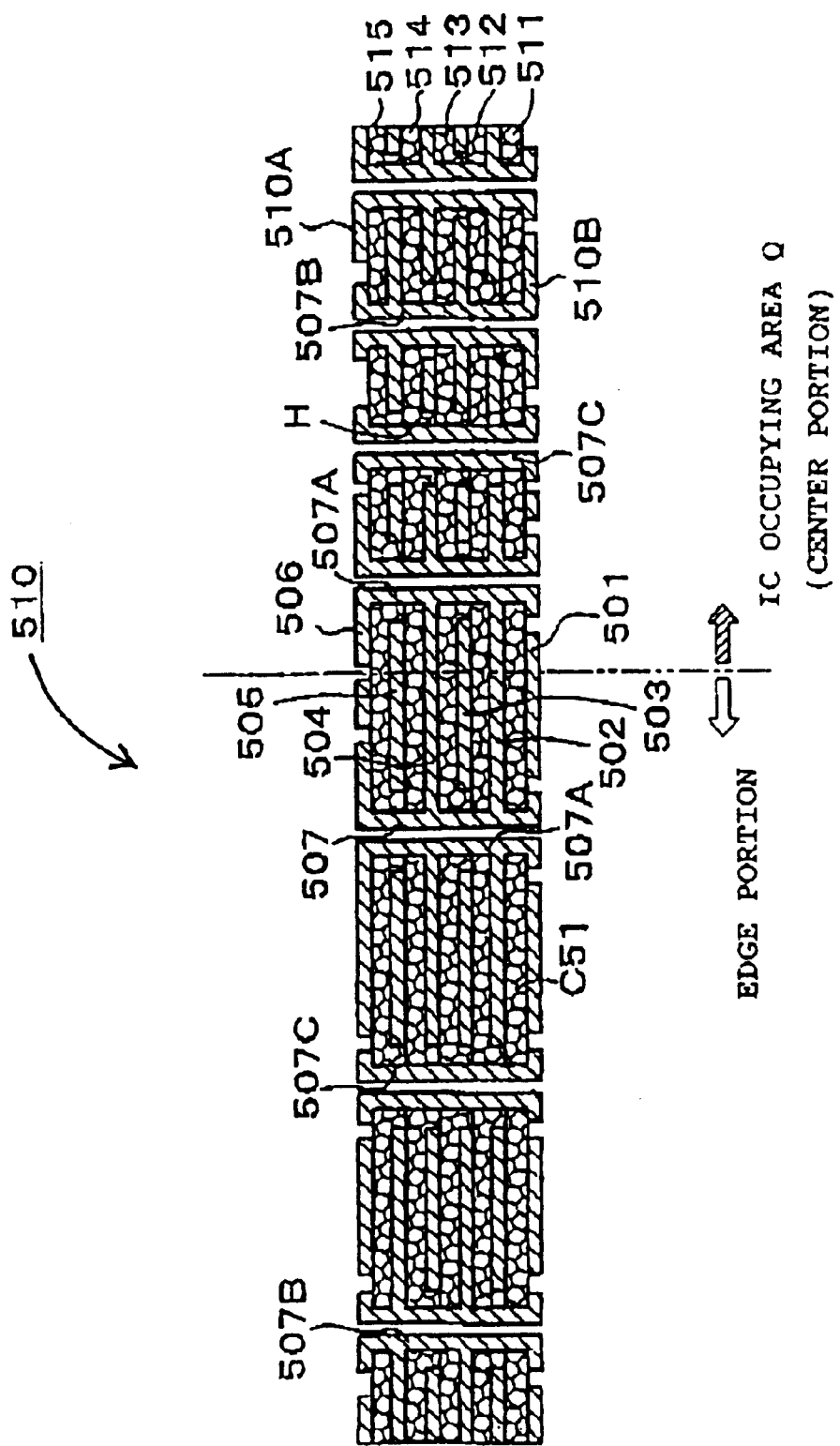
FIG. 9 is a partially enlarged sectional view showing a core substrate according to a modification of the first embodiment.

First, the core substrate 510 according to the modification will be described. As shown in the partially enlarged sectional view of FIG. 9, similarly to the core substrate 110 of the first embodiment, the core substrate 510 includes five composite dielectric layers 511–515, metal layers 501–506 of Cu, and through-hole conductors 507 of Cu. The composite dielectric layers 511–515 and the metal layers 501–506 are stacked alternately such that the metal layers 501–506 are disposed between the composite dielectric layers 511–515, on the lower surface (in FIG. 9) of the composite dielectric layer 511, and on the upper surface (in FIG. 9) of the composite dielectric layer 515. The through-hole conductors 507 are each formed on the wall of a through-hole H. The composite dielectric layers 511–515 and the metal layers 501–506 constitute a laminated capacitor C51 having five dielectric layers.

Among the interior metal layers 502–505, alternate first interior metal layers 502 and 504 are connected directly to the first through-hole conductor 507A to thereby be electrically connected to a metal layer 506 on the front surface 510A of the core substrate and a metal layer 501 on the back surface 510B of the core substrate. The remaining second interior metal layers 503 and 505 are connected directly to the second through-hole conductor 507B to thereby be electrically connected to the metal layer 506 on the front surface 510A of the core substrate and the metal layer 501 on the back surface 501B of the core substrate. The exterior metal layers 501 and 506 serve as electrodes of the laminated capacitor C51 and as wiring layers.

A predetermined through-hole conductor 507, such as the third through-hole conductor 507C, is not electrically connected to the interior metal layers 502–505, so as to be available for use as, for example, a signal circuit line. As described above, electrical continuity is established between the metal layers 502 and 504 and the metal layer 506 and between the metal layers 503 and 505 and the metal layer 501. Accordingly, through alternating arrangement of the metal layers (501–506) and the composite dielectric layers (511–515), the laminated capacitor C51 is implemented.

Since the three types of through-hole conductors 507A, 507B, and 507C extend between the front surface 510A and the back surface 510B of the core substrate 510, a wiring layer formed on the back surface 510B of the core substrate 510 can be connected to a wiring layer formed on the front surface 510A of the core substrate 510 by means of the through-hole conductors 507.

For example, when the first through-hole conductor 507A is connected to a power supply line and the second through-hole conductor 507B is connected to a ground line, a laminated capacitor C51 is connected in parallel between the power supply line and the ground line, so that noise appearing in these lines can be reduced or absorbed. Since a signal line is connected to the third through-hole conductor 507C, the signal can be passed through the core substrate 510, while being isolated from the layered capacitor C51.

Figure 11:
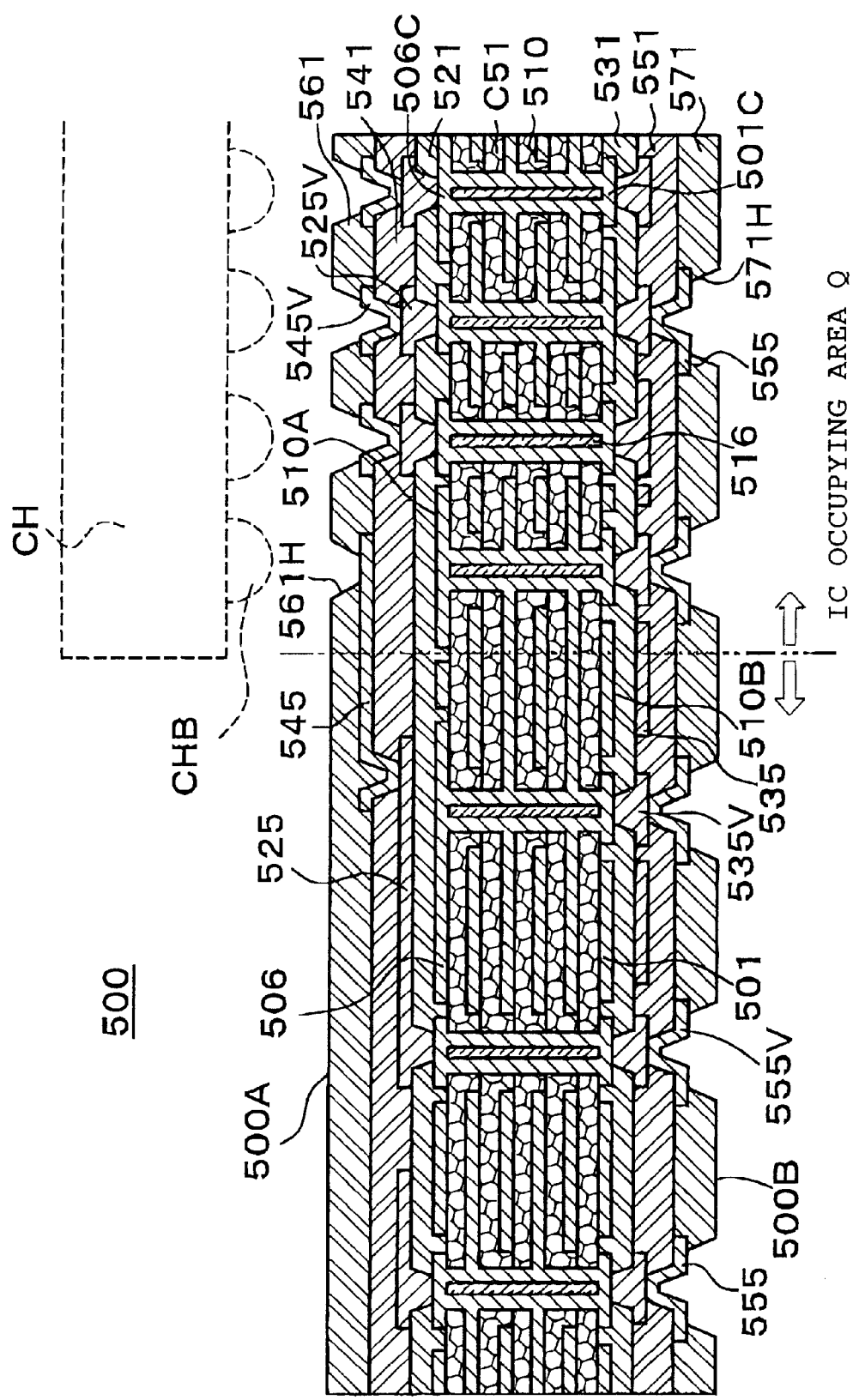
FIG. 11 is a partially enlarged cross sectional view showing a printed wiring board according to the modification of the first embodiment.
Figure 12:
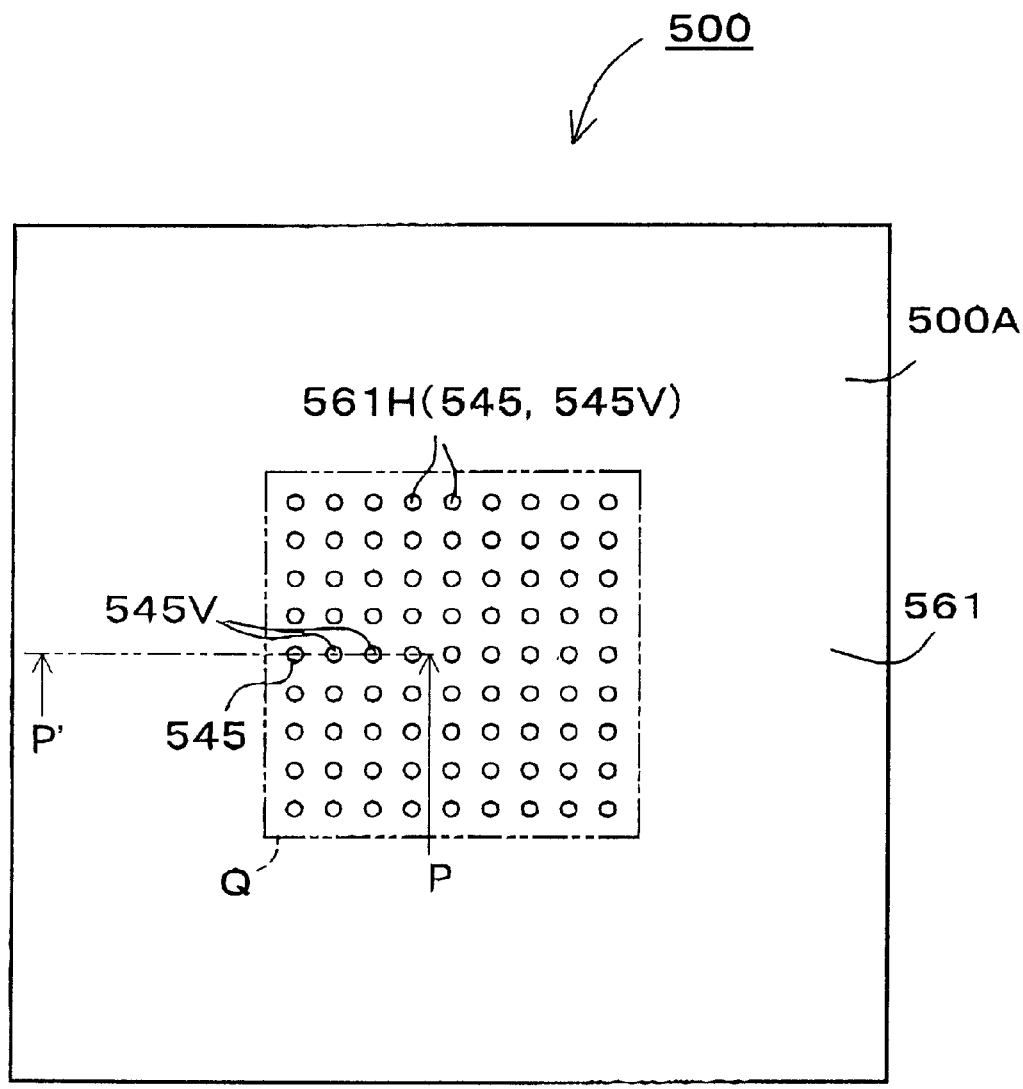
FIG. 12 is a top plan view of the printed wiring board according to the modification of the first embodiment.
Figure 13:
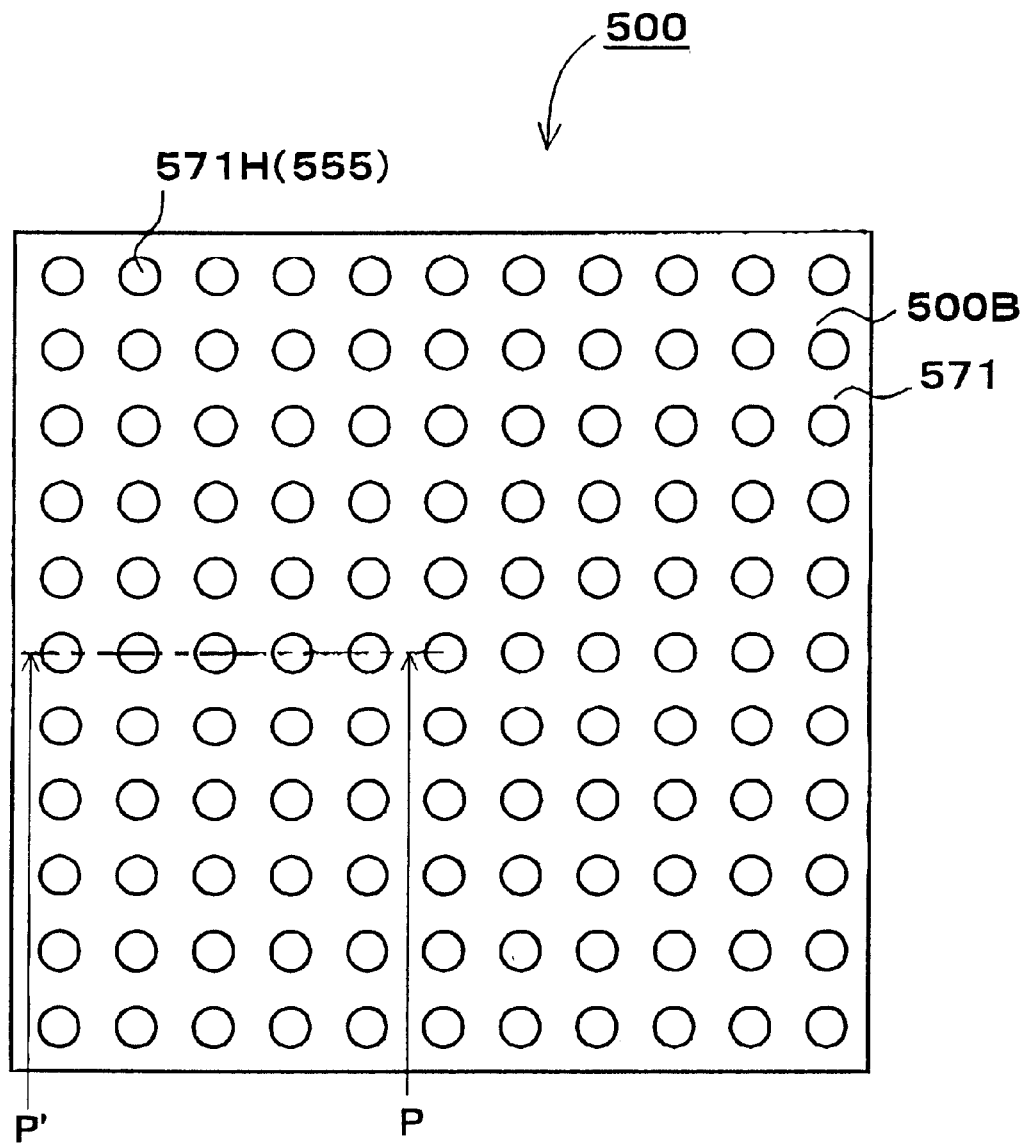
FIG. 13 is a bottom plan view of the printed wiring board according to the modification of the first embodiment.

Having described the core substrate 510, the printed wiring board 500 according to the present modification will now be described. FIGS. 11–13 show a partially enlarged sectional view, a plan view, and a bottom view, respectively, of the printed wiring board 500. The printed wiring board 500 has a sectional structure substantially identical with that of the first embodiment. The printed wiring board 500 includes the core substrate 510, three insulating resin layers 521, 541, and 561 and two wiring layers 525 and 545 formed on the front surface 510A of the core substrate 510; and three insulating resin layers 531, 551, and 571 and two wiring layers 535 and 555 formed on the back surface 510B of the core substrate 510. The wiring layers 525, 545, 535, and 555 are disposed between the insulating resin layers 521, 541, 561, 531, 551, and 571 and include via conductors 525V, 545V, 535V, and 555V, respectively, adapted to establish electrical connection with the corresponding metal layers or wiring layers located therebeneath. The through-hole conductors 507 formed in the core substrate 510 are filled with a plug material 516 of epoxy resin and are closed by means of block portions 501C and 506C formed on the metal layers 501 and 506, respectively.

Further, as shown in FIG. 12, an IC chip is mounted on the front surface 500A of the printed wiring board 500 at a center portion, as viewed in a plan view, and in the center portion, a large number of openings 561H are formed in a matrix pattern in the insulating resin layer 561 to thereby enable flip chip bonding of the terminals CHB of the IC chip CH. As is easily understood from FIG. 11, the wiring layer 545 or the via conductor 545V is exposed at each of the openings 561H.

As shown in the bottom view of FIG. 13, a large number of openings 571H are formed in a matrix pattern over the entire surface of the insulating resin layer 571. In order to enable connection with other printed wiring boards, such as a motherboard, the wiring layer 555 including the via conductor 555V is exposed at each of the openings 571H.

Similarly to the printed wiring board 100 of the first embodiment, the printed wiring board 500 integrally contains the laminated capacitor C51 formed in the core substrate 510. Accordingly, the IC chip CH mounted on the front surface (component side) 500A of the printed wiring board 500 is located in the vicinity of the laminated capacitor C51, and thus a connecting circuit line for connecting the IC chip CH and the laminated capacitor C51 is very short, thereby reliably eliminating noise. Further, signal circuit lines can have a conventional width for such circuit lines and can be routed in a conventional manner, so that wiring layers including signal wiring layers can be easily designed. Further, the block portions 501C and 506C are formed, and the via conductors 525V and 535V are formed as block-portion via conductors for direct contact with the block portions 501C and 506C. By virtue of this structure, the through-hole conductors 507 and the block-portion via conductors 525V and 535V can be connected with each other over a very short distance, so that the resistances and inductances of the wiring layer 525, etc. can be reduced.

Further, the printed wiring board 500 employs a stacked via structure such that the via conductors 545V and 555V are stacked on the via conductors 525V and 535V. In particular, as indicated by a two-dot chain line in FIG. 11, the above-described stacked via structure is employed for wiring used in establishing connections between the terminals CHB of the IC chip CH and the first and second through-hole conductors 507A and 507B within a portion of the printed wiring board 500 corresponding to the IC chip CH mounted on the printed wiring board 500, i.e., an IC occupying area O, which is a projection of the IC CH in the thickness direction thereof. Employment of such a stacked via structure enables the wiring between the laminated capacitor C51 and the IC chip to be shortened, so that the resistance and inductance of the wiring can be reduced further in order to more effectively prevent entry of noise.

As described above, the IC chip CH is mounted on the front surface 500A of the printed wiring board 500, and the printed wiring board 500 is connected to another printed wiring board on the side of the back surface 500B. Therefore, the printed wiring board 500 includes therein wiring for establishing connections between the opening 561H and the wiring layer 555 exposed within the opening 571H.

Figure 10:
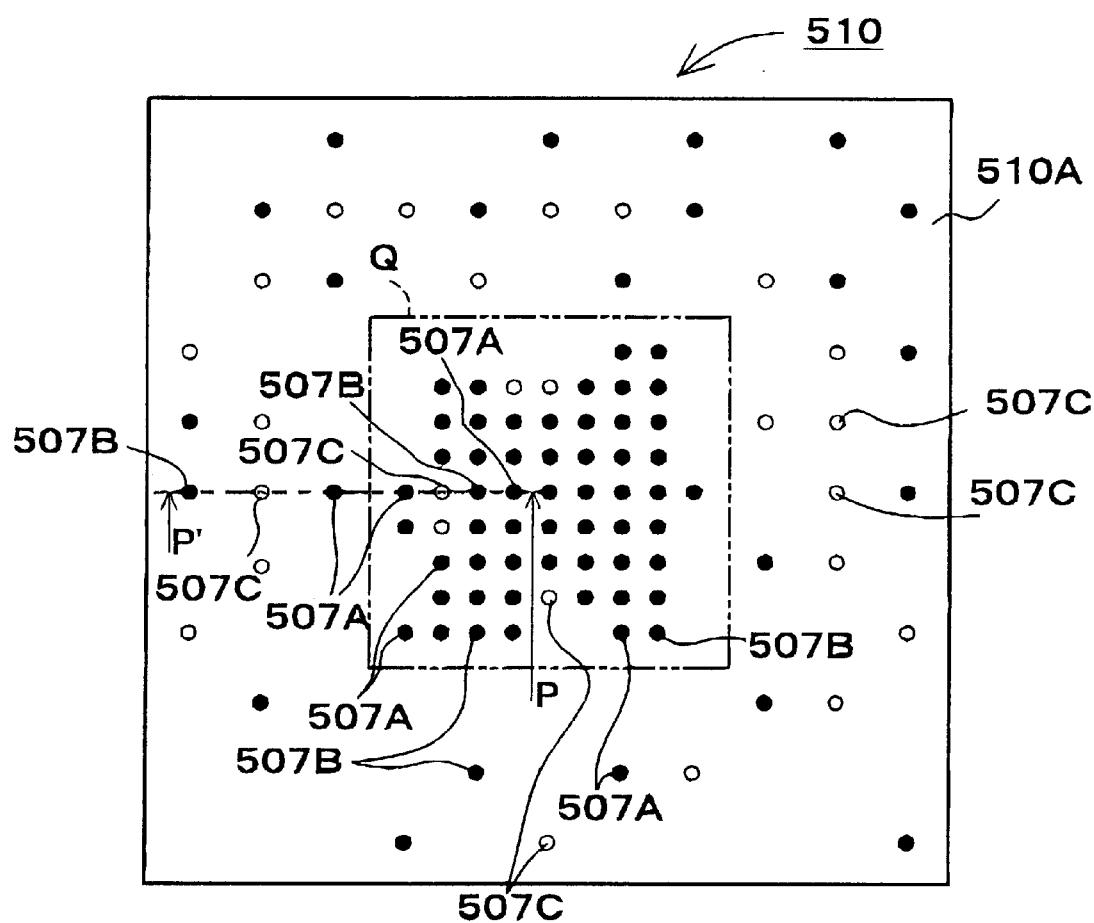
FIG. 10 is a plan view showing a preferred layout of arrangement of through-hole conductors of the core substrate according to the modification of the first embodiment.

In order to form such internal wiring, the above-described three types of through-hole conductors 507 are formed in the core substrate 510. In the core substrate 510 of the modification being considered, as shown in FIG. 10, the through-hole conductors 507 are arranged in accordance with a predetermined planar layout. In FIG. 10, the first and second through-hole conductors 507A and 507B are each represented by a black dot, and the third through-hole conductor 507C is represented by a white dot or circle in order to facilitate an understanding of difference in layout among through-hole conductors of different types. In FIG. 10 as well, an area surrounded by a two-dot chain line represents the IC occupying area O. The IC occupying area O is located at an approximate center of the core substrate 510. Further, a cross section taken along a chain line PP' corresponds to the cross section shown in FIG. 9.

As is readily apparent from FIG. 10, in the center portion or the IC occupying area O, a large number of the first through-hole conductors 507A and the second through-hole conductors 507B are formed, whereas only a small number of the third through-hole conductors 507C are formed, so that the number of the third through-hole conductors 507C is smaller than that of the first through-hole conductors 507A and the second through-hole conductors 507B. On the other hand, outside the IC occupying area O, a large number of the third through-hole conductors 507C are formed. When only the third through-hole conductors 507C are considered, the number of the conductors formed outside the IC occupying area C is greater than that of the conductors formed within the IC occupying area O. In other words, most of the third through-hole conductors 507C used for signal wiring lines are formed outside the IC occupying area O.

The reasons why the through-hole conductors 507 are arranged in the above-described manner are as follows. It is preferred that the terminals CHB of the IC chip CH be connected to the respective electrodes (metal layers) 501–506 of the laminated capacitor C51 of the core substrate 510, or to the first through-hole conductor 507A and the second through-hole conductor 507B, over the shortest possible distance. Therefore, the first through-hole conductor 507A and the second through-hole conductor 507B are preferably positioned directly under the IC chip CH. In addition, when a large number of the first through-hole conductors 507A and the second through-hole conductors 507B are formed and are connected in parallel, the resistances of the first and second through-hole conductors 507A and 507B and the resistance of wiring between these conductors and the IC chip can be further reduced. Accordingly, it is desired that a large number of the first through-hole conductors 507A and the second through-hole conductors 507B be formed directly under the IC chip CH or in the IC occupying area O.

On the other hand, since the signal wiring lines formed by use of the third through-hole conductors 507C are not required to have very low resistance or very low inductance, the third through-hole conductors 507C are not necessarily required to be formed within the IC occupying area O.

Accordingly, when as many as possible of the third through-hole conductors 507C are disposed outside the IC occupying area O, it becomes possible to arrange a large number of the first and second through-hole conductors 507A and 507B without consideration of the third through-hole conductors 507C. In other words, it becomes possible to connect the laminated capacitor C51 and the IC chip CH via connection wiring having further reduced resistance and inductance.

In the printed wiring board 500 of the present modification, the via conductors 525V and 535V are stacked directly on the block portions 501C and 506C provided on the through-hole conductors 507, and the via conductors 545V and 555V are stacked on the via conductors 525V and 535V, respectively, to thereby form a stacked via structure. Therefore, the through-hole conductors 507 can be connected to the IC chip CH by means of connection wiring having further reduced resistance and inductance.

Moreover, in the printed wiring board 500 and the core substrate 510, the three types of through-hole conductors 507 are disposed such that the number of the first and second through-hole conductors 507A and 507B is greater than that of the third through-hole conductors 507C within the IC occupying area O and such that the number of the third through-hole conductors 507C formed outside the IC occupying area O is greater than the number of the third through-hole conductors 507C within the IC occupying area O. Therefore, a large number of the first and second through-hole conductors 507A and 507B can be easily formed, so that the laminated capacitor C51 can be connected with the IC chip CH by means of connection wiring having further reduced resistance and inductance.

The printed wiring board 500 and the core substrate 510 according to the modification just described can be produced in the same manner as in the first embodiment.

Second Embodiment

Figure 14:
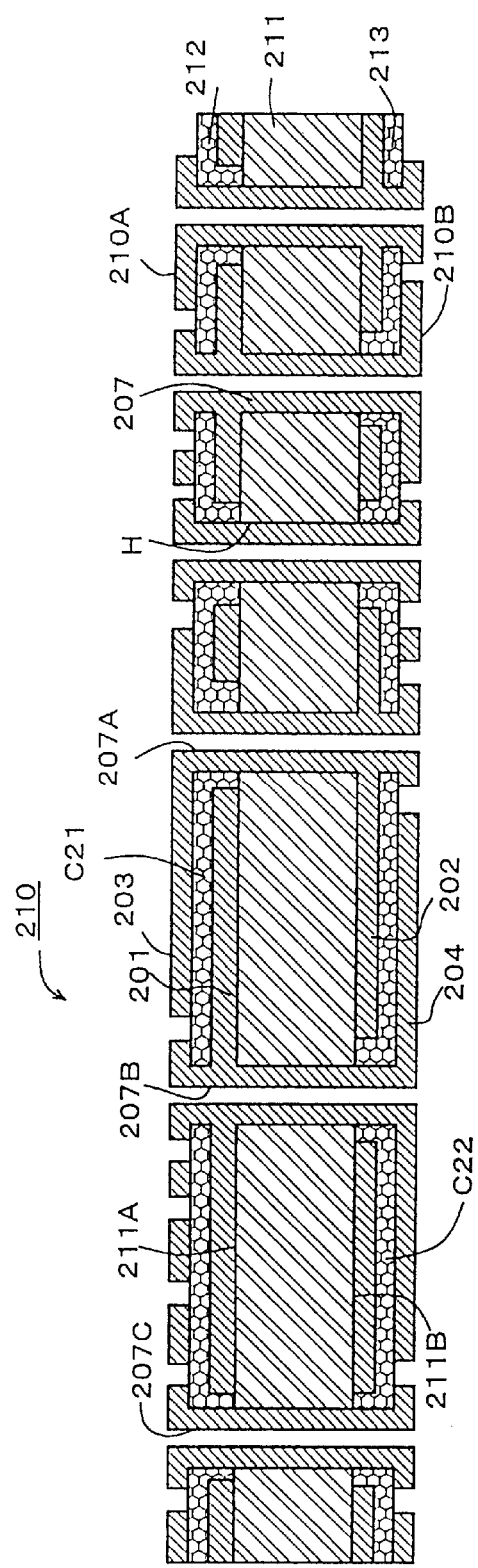
FIG. 14 is a partially enlarged sectional view showing a core substrate according to a second embodiment of the present invention.

A second embodiment of the present invention will next be described. As shown in FIG. 14, a core substrate 210 of the present embodiment is different from the core substrate 110 of the first embodiment in that the core substrate 210 includes a center substrate 211 and laminated capacitors formed on opposite sides of the center substrate 211. Thus, different portions will be mainly described while the description of the same portions will be omitted or simplified.

The core substrate 210 includes the center substrate 211 made of a glass-fiber-epoxy-resin composite material and having a thickness of 600 $\mu$m and laminated capacitors C21 and C22 formed respectively on front and back surfaces 211A and 211B of the center substrate 211. Specifically, the core substrate 210 includes the center substrate 211; composite dielectric layers 212 and 213, each having a thickness of 50 $\mu$m, made of a ceramic-metal-resin composite material, which is prepared through dispersion of 30 vol % $BaTiO_3$ and 20 vol % Cu powder into epoxy resin; metal layers 201 and 203 of Cu disposed such that the composite dielectric layer 212 is sandwiched therebetween, and metal layers 202 and 204 of Cu disposed such that the composite dielectric layer 213 is sandwiched therebetween; and through-hole conductors 207 of Cu formed on the respective walls of through holes H. The metal layers 201 and 203 and the composite dielectric layer 212 sandwiched therebetween constitute the laminated capacitor C21. The metal layers 202 and 204 and the composite dielectric layer 213 sandwiched therebetween constitute the laminated capacitor C22. The interior metal layer 201 is electrically connected to the metal layer 204 formed on the back core surface 210B by means of a second through-hole conductor 207B. The interior metal layer 202 is electrically connected to the metal layer 203 formed on the front core surface 210A by means of a first through-hole conductor 207A. Specifically, the first through-hole conductor 207A is connected directly to the metal layer 203, which forms one electrode of the front-side laminated capacitor C21, among the metal layers included in the laminated capacitor C21, and is connected directly to the metal layer 202, which forms one electrode of the back-side laminated capacitor C22, among the metal layers included in the laminated capacitor C22. Further, the second through-hole conductor 207B is connected directly to the metal layer 201, which forms the other electrode of the front-side laminated capacitor C21, and is connected directly to the metal layer 204, which forms the other electrode of the back-side laminated capacitor C22, among the metal layers included in the laminated capacitor C22. The exterior metal layers 203 and 204 serve as electrodes of the laminated capacitors C21 and C22, respectively, and as wiring layers. It is noted that a preselected through-hole conductor 207, such as a third through-hole conductor 207C, is not electrically connected to the interior metal layers 201 and 202 so as to be used as, for example, a signal circuit line.

Since the three types of through-hole conductors 207A, 207B, and 207C extend between the front surface 210A and the back surface 210B of the core substrate 210, a wiring layer formed on the back surface 210B of the core substrate 210 can be connected to a wiring layer formed on the front surface 210A of the core substrate 210 by means of these through-hole conductors 207.

In the core substrate 210, a single composite dielectric layer 212 and two metal layers 201 and 203 are formed on the front surface 211A of the center substrate 211, and a single composite dielectric layer 213 and two metal layers 202 and 204 are formed on the back surface 211B of the center substrate 211. In addition, each layer on the front side is formed of the same material as that of the corresponding layer on the back side and has the same thickness as that of the corresponding layer on the back side. As a result, the core substrate 210 tends not to warp, i.e., to be free of warpage such as which would otherwise occur due to differences in material and thickness.

As in the case of the core substrate 110 of the first embodiment, the laminated capacitors C21 and C22 are incorporated in the core substrate 210, i.e., in a printed wiring board fabricated through formation of insulating resin layers and wiring layers on the core substrate 210. Accordingly, an IC chip (not shown) mounted on the printed wiring board is located in the vicinity of the laminated capacitor C21 or C22, thereby reliably eliminating noise. Specifically, when the first through-hole conductor 207A is connected to a power supply line and the second through-hole conductor 207B is connected to a ground line, the laminated capacitors C21 and C22 are connected in parallel between the power supply line and the ground line, so that noise appearing on these lines an be reduced or absorbed. Since a single line is connected to the third through-hole conductor 207C, the signal can be passed through the core substrate 210, while being isolated from the layered capacitors C21 and C22. Through employment of the center substrate 211 made of a glass-fiber-epoxy-resin composite material and thicker than the composite dielectric layers 212 and 213, the mechanical strength of the core substrate 210 is increased, so that the core substrate 210 is resistant to deformation. Therefore, handling of the core substrate 210 is facilitated. Since the center substrate 211 has a high rigidity, the center substrate 211 can provide the rigidity required by the entire core substrate 210.

In the first embodiment, the laminated capacitor C1 includes the composite dielectric layers 111–115, which are formed of a composite material prepared through dispersion of $BaTiO_3$ powder and Cu powder into epoxy resin. However, part of constituent composite dielectric layers of a laminated capacitor may be formed of a material that does not contain high-permittivity powder, even though the capacitance of the resultant laminated capacitor decreases. For example, the composite dielectric layers 111 and 115 may be replaced with dielectric layers formed of a resin that does not contain $BaTiO_3$ powder or even contains neither $BaTiO_3$ powder nor Cu powder.

Next, a printed wiring board 200 will be described. As in the case of the first embodiment, the printed wiring board 200 shown in FIG. 15 includes the core substrate 210; three insulating resin layers 221, 241, and 261 and two wiring layers 225 and 245 formed on the front surface 210A of the core substrate 210; and three insulating resin layers 231, 251, and 271 and two wiring layers 235 and 255 formed on the back surface 210B of the core substrate 210. The wiring layers 225, 245, 235, and 255 are disposed between the insulating resin layers 221, 241, 261, 231, 251, and 271 and include via conductors 225V, 245V, 235V, and 255V, respectively. The through-hole conductors 207 formed in the core substrate 210 are filled with a plug material 216 of epoxy resin and are closed by means of block portions 203C and 204C formed on the metal layers 203 and 204, respectively.

The printed wiring board 200 also integrally contains the laminated capacitors C21 and C22. Accordingly, an IC chip (not shown) mounted on the printed wiring board surface 200A is located in the vicinity of the laminated capacitors C21 and C22, whereby connecting circuit lines for connecting the IC chip and the laminated capacitor C21 and C22 become very short, thereby reliably eliminating noise. As in the case of the first embodiment, the wiring layers 225, 245, 235, and 255 can have a conventional circuit line width and can be routed in a conventional manner. Thus, printed wiring layers including signal wiring layers can be designed easily.

Further, the block portions 203C and 204C are formed, and via conductors 225V and 235V are formed above the block portions 203C and 204C. The via conductors 225V and 235V serve as block-portion via conductors which establish direct connection with the block portions 203C and 204C. By virtue of this construction, the through-hole conductors 207 and the via conductors 225V and 235V can be connected with each other over a very short distance, so that the resistances and inductances of the wiring layer 225, etc. can be reduced. Therefore, the above-described structure is particularly effective in providing shortening the wiring between the laminated capacitors C21 and C22 and IC chip and thereby reducing the resistance and inductance of the wiring in order to prevent noise entry.

Figure 2:
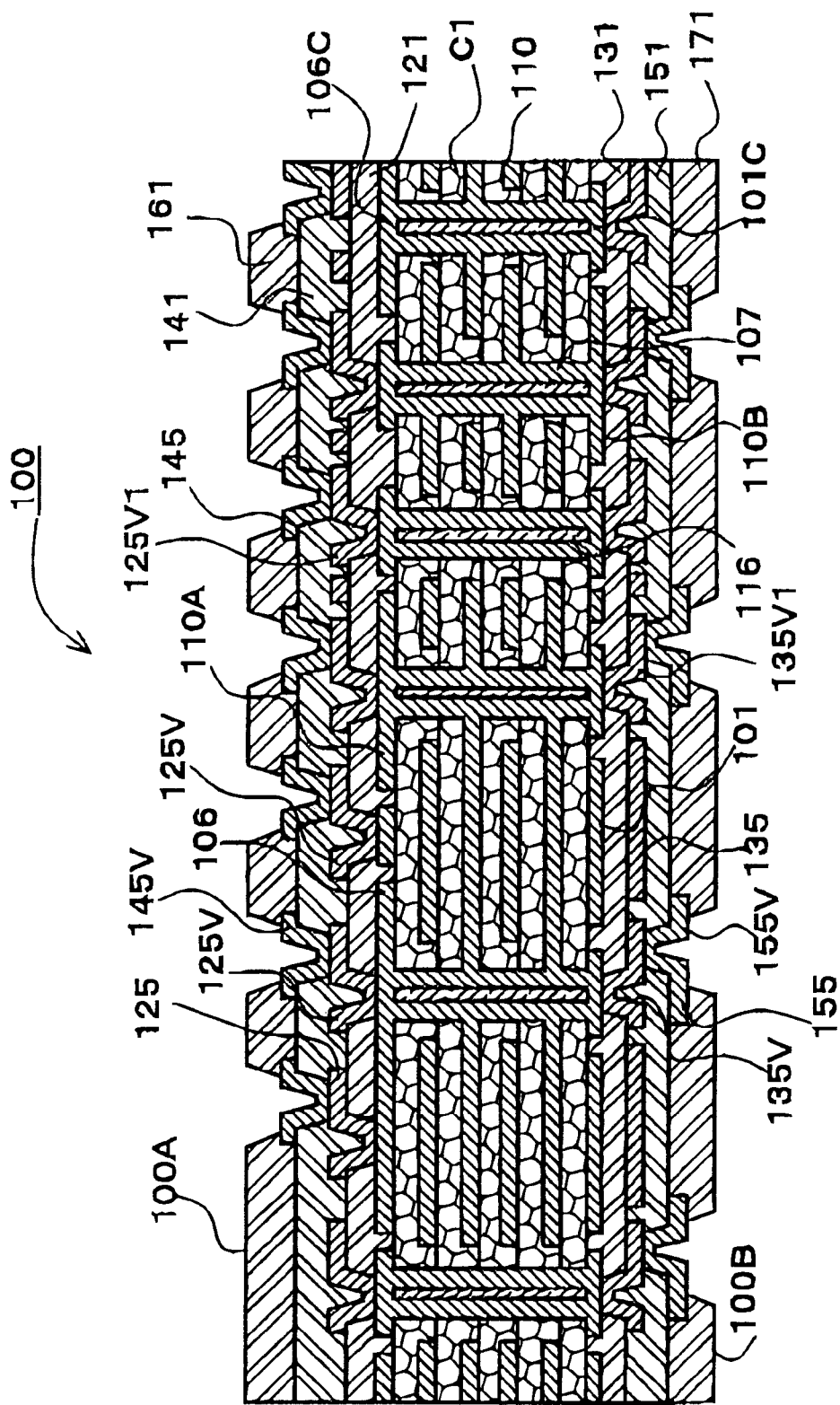
FIG. 2 is a partially enlarged sectional view showing a printed wiring board according to the first embodiment.
Figure 15:
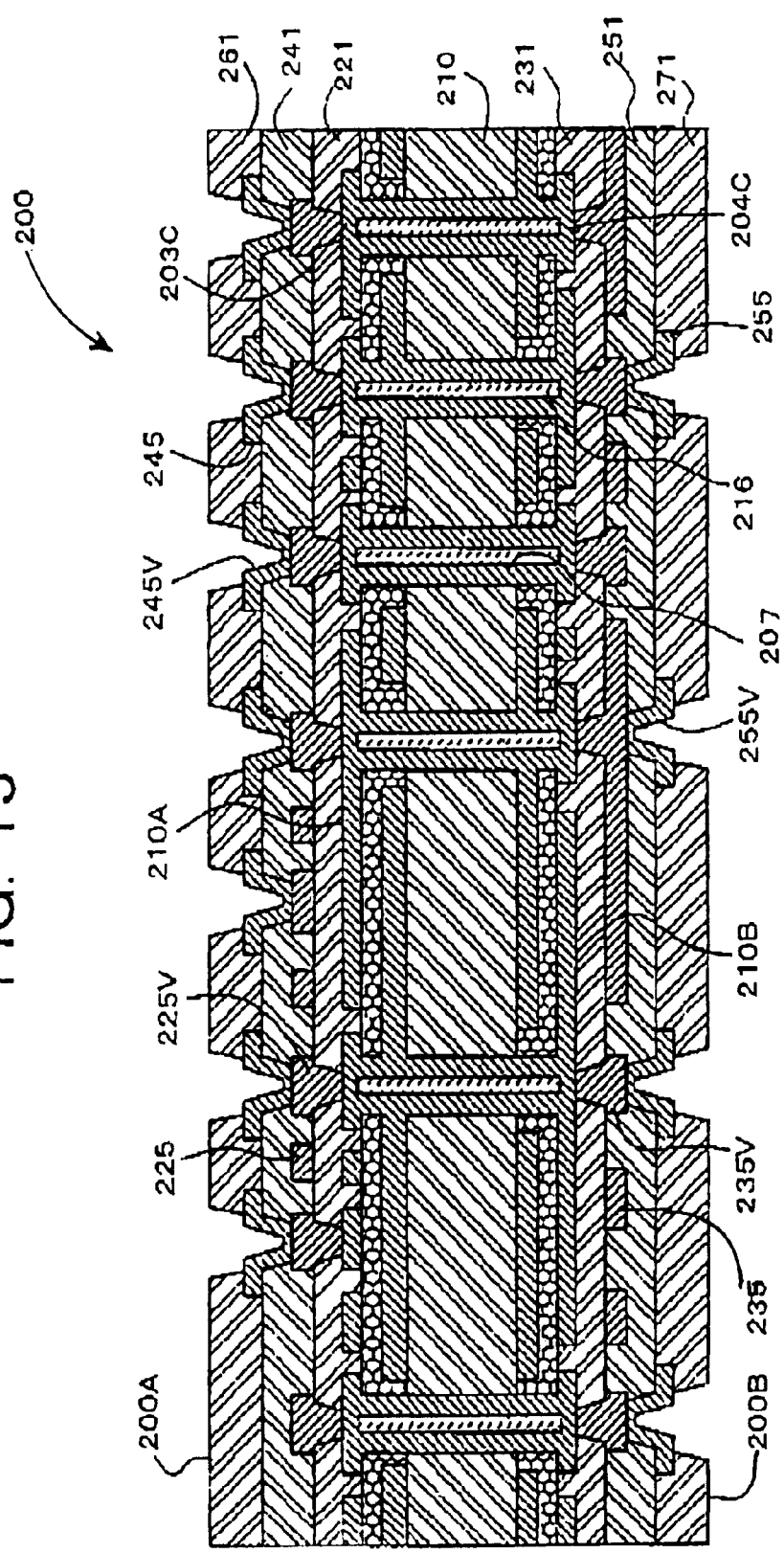
FIG. 15 is a partially enlarged sectional view showing a printed wiring board according to the second embodiment.

The first embodiment employs staggered via arrangement; i.e., the via conductors 125V, 145V, 135V, and 155V are arranged in a staggered manner (see FIG. 2). In contrast, as shown in FIG. 15, the printed wiring board 200 employs stacked via arrangement; i.e., the via conductors 225V and 245V are stacked and the via conductors 235V and 255V are stacked. Through employment of stacked via arrangement, circuit lines extending between the board surface 200A (200B) and the capacitor electrodes, i.e., the metal layers 201 (202) and 203 (204) can be rendered short. Further, in contrast to the case where dish-shaped via conductors are arranged in a staggered manner, the inner via conductors 225V and 235V are filled with conductor, whereby circuit lines can be rendered thick and thus can reduce resistance thereof. As a result, the inductance of the circuit lines becomes small, thereby suppressing entry of noise into the circuit lines.

Figure 16:
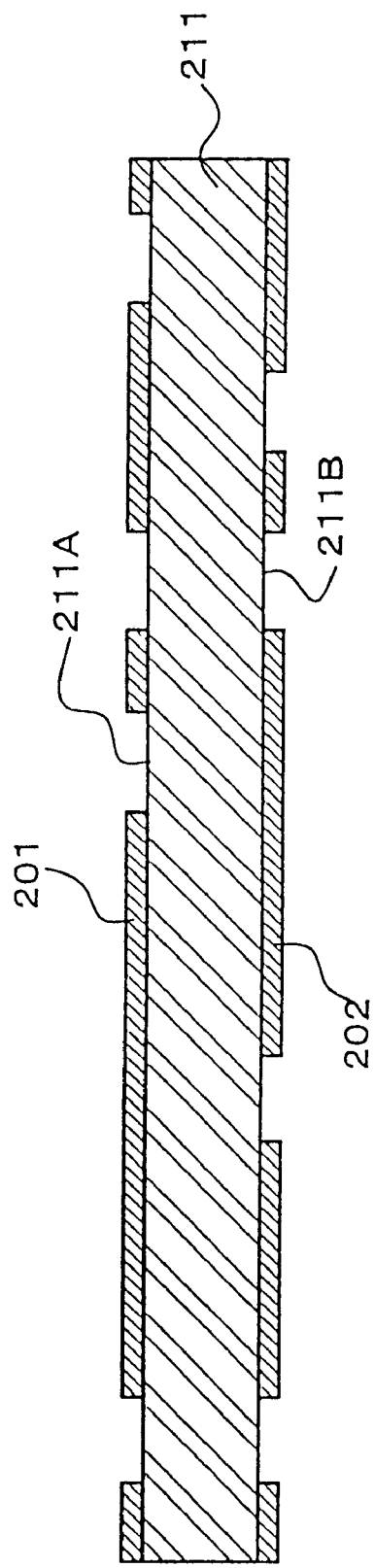
FIG. 16 is a partially enlarged sectional view showing a center substrate having metal layers of a predetermined pattern formed on opposite sides thereof.

The method for fabricating the core substrate 210 will now be described. The step of forming a three-layer film is the same as that of the first embodiment (see FIG. 3). As shown in FIG. 16, the metal layers 201 and 202, patterned as desired, are previously formed on the front and back surfaces 211A and 211B of the center substrate 211.

Figure 17:
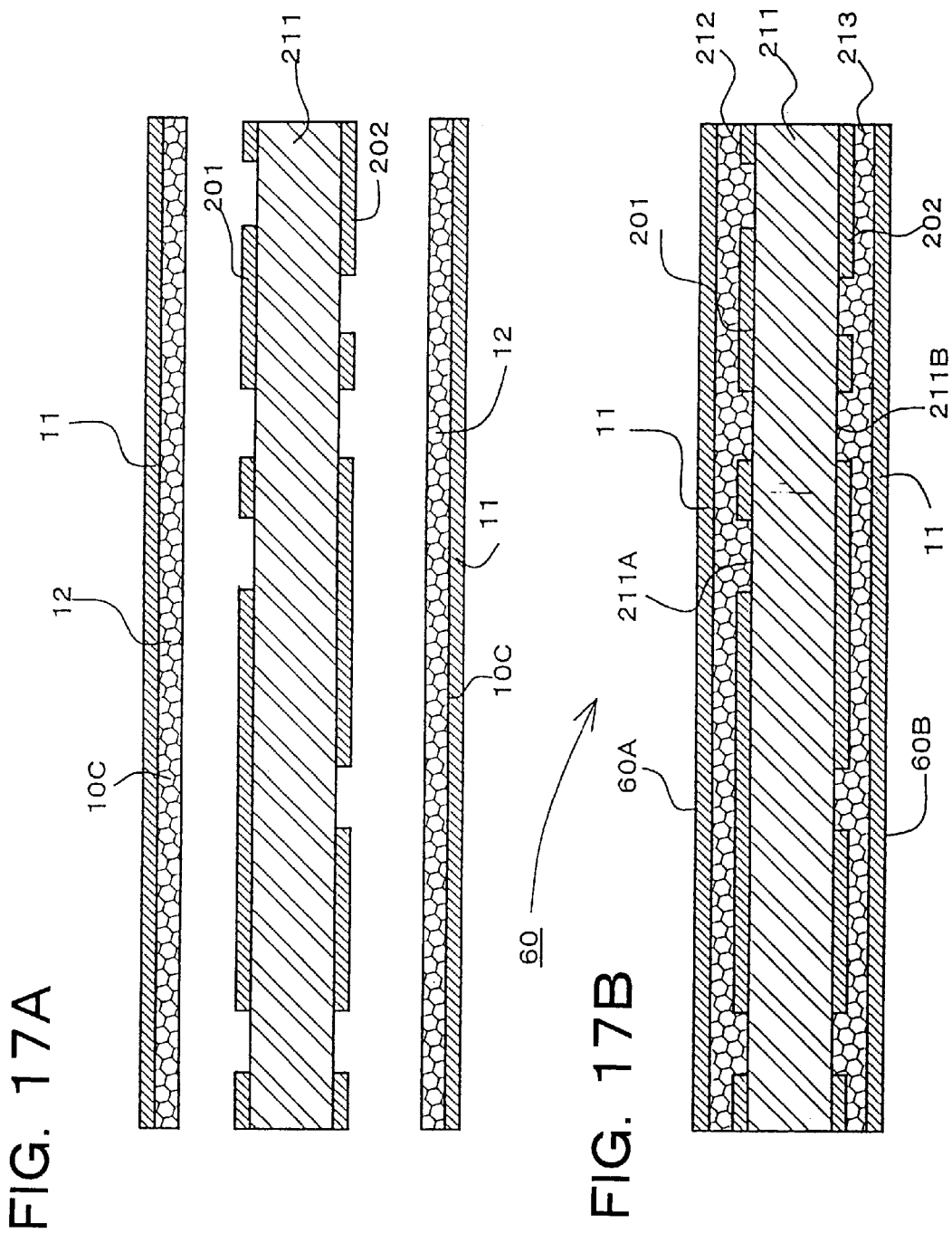

Subsequently, in the step of forming a laminate, as shown in FIG. 17A, two-layer films 10C obtained through removal of the reinforcement films RF from the three- layer films 10 are placed on the center substrate 211 such that the metal layers 201 and 202 are brought into contact with the corresponding semi-cured composite dielectric layers 12. Then, the resultant laminar structure is thermally pressed in the vertical direction of FIG. 17A in a vacuum at a temperature of 180° C. and a pressure of 30 kg/cm$^2$ for 2 hours so as to cure epoxy resin of the composite dielectric layers 12, thereby yielding a laminate 60 shown in FIG. 17B. In the laminate 60, the metal layer 201 of a predetermined pattern, the composite dielectric layer 212, and the copper foil 11 are arranged in layers on the front surface 211A of the center substrate 211, while the metal layer 202 of a predetermined pattern, the composite dielectric layer 213, and the copper foil 11 are arranged in layers on the back surface 211B o f the center substrate 211.

Figure 18:
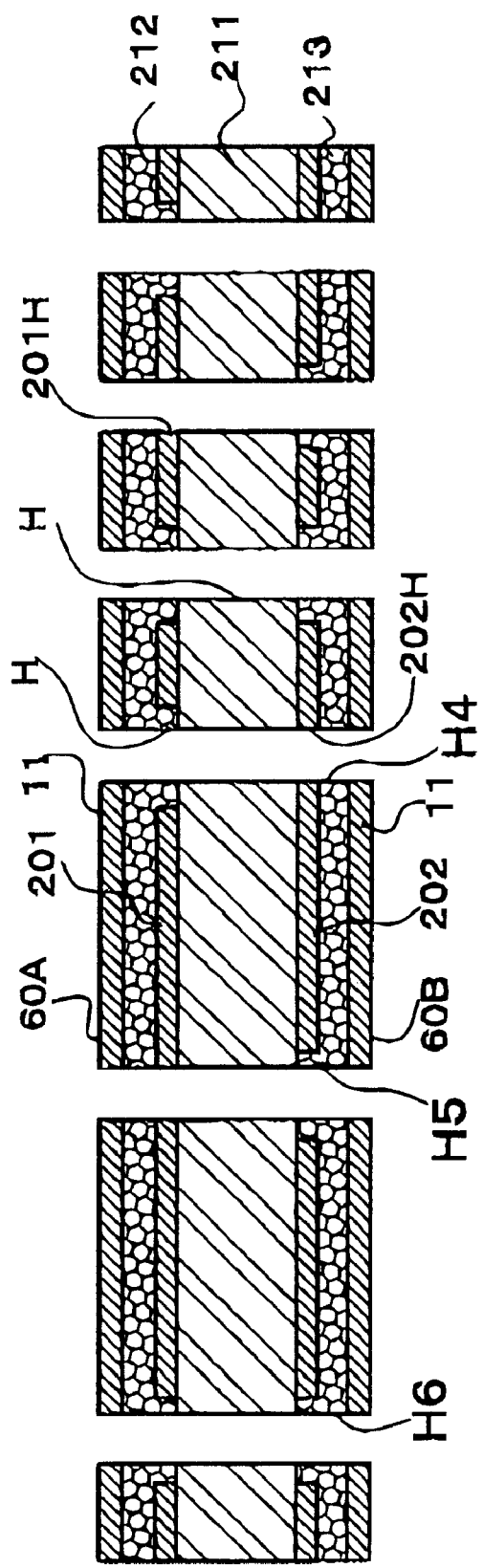

In the subsequent step of forming through-holes, as shown in FIG. 18, through-holes H having a diameter of 60 μm are formed in the laminate 60 at predetermined positions in such a manner as to extend between the front surface 60A and the back surface 60B, by use of a fourth harmonic of a YAG laser. End faces 201H and 202H of the metal layers 201 and 202 are exposed on the walls of some through-holes H. In other words, three kinds of through-holes, viz., a first through-hole H4, a second through-hole H5, and a third through-hole H6, are formed. As a consequence, the metal layer 202 is exposed to the inner circumference of the first through-hole H4; the metal layer 201 is exposed to the inner circumference of the second through-hole H5; and neither the metal layer 201 nor the metal layer 202 is exposed to the inner circumference of the third through-hole H6.

In the step of forming a metal layer on the front and back surfaces 60A and 60B of the laminate 60, the through-hole conductors 207 are formed on the corresponding walls of the through-holes H by a known PTH process. Also, through utilization of the copper foils 11, the metal layers 203 and 204 patterned as designed are formed, thus completing the core substrate 210 (see FIG. 14). Notably, among the through-hole conductors 207, for example, the first and second through-hole conductors 207A and 207B are electrically connected to the end face 202H of the metal layer 202 and the end face 201H of the metal layer 201, respectively. Thus, as mentioned previously, electrical continuity is established between the metal layers 201 and 202 serving as opposite electrodes of the laminated capacitor and the metal layers 203 and 204 formed on the front and back surfaces 210A and 210B, respectively, by means of the first and second through-hole conductors 207A and 207B.

As in the case of the first embodiment, the core substrate 210 is inspected for a short circuit in and insulation resistance of or capacitance of the laminated capacitors C21 and C22. For example, when the laminated capacitor C21 (C22) suffers a short circuit caused by a short circuit between the metal layers 201 and 203 (202 and 204) or fails to exhibit a capacitance falling within a predetermined range, the core substrate 210 is disposed of as a defective core substrate. As in the case of the core substrate 110, a higher capacitance is preferred. Conceivable measures to increase the capacitance include the following: the thickness of the composite dielectric layers 212 and 213 is reduced; the area of the core substrate 210 is increased; and the metal powder (such as copper powder) content of the composite dielectric layers 212 and 213 is increased. However, these measures are likely to cause a short circuit in the laminated capacitor C21 (C22), potentially resulting in a reduced yield of the core substrates 210. The present embodiment enables the core substrate 210 to be checked for conditions of the laminated capacitors C21 and C22. If the laminated capacitor C21 (C22) is found defective, the bare core substrate 210 can be disposed of or otherwise discarded. Therefore, the printed wiring board 200 in process of, or after, fabrication is less likely to suffer a defective laminated capacitor C21 (C22), so that the fabrication of the printed wiring boards 200, which will be described later, is less likely to suffer a reduction in yield caused by occurrence of a defective laminated capacitor C21 (C22) and a loss caused by disposal of the printed wiring boards 200 having a defective laminated capacitor C21 (C22).

Figure 19:
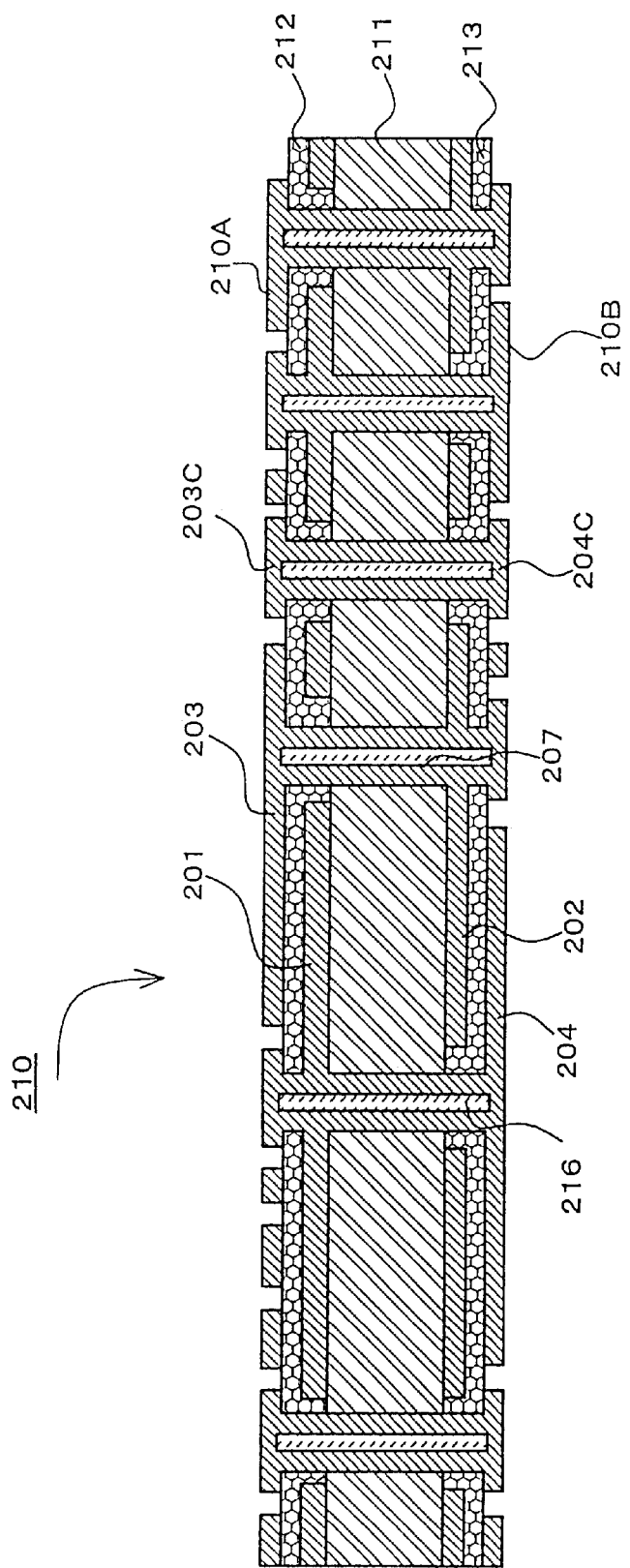

As in the case of the first embodiment, the core substrate 210 may be formed into the printed wiring board 200 by a known process. Specifically, as shown in FIG. 19, through-holes formed in the corresponding through-hole conductors 207 are filled with the plug material 216 of epoxy resin and are closed by the block portions 203C and 204C, which are formed by plating.

Figure 20:
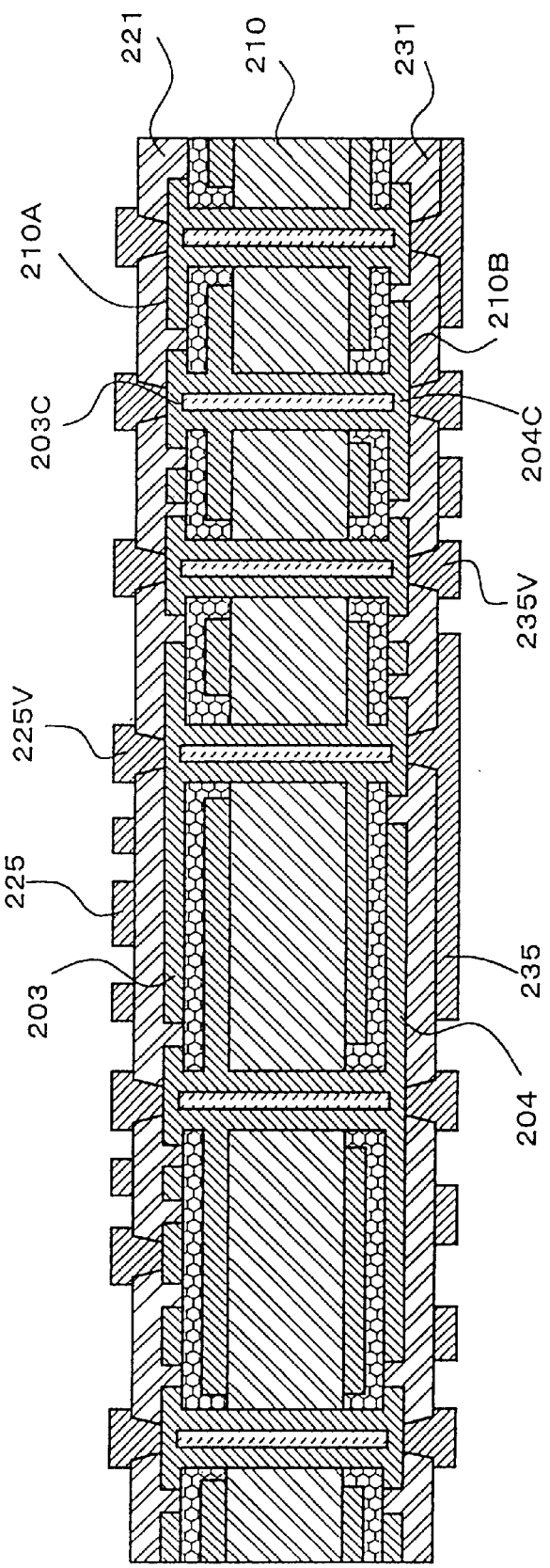

Next, as shown in FIG. 20, a photosensitive epoxy resin film is affixed to the front and back surfaces 210A and 210B of the core substrate 210, followed by exposure and development to thereby form via holes in the films. Subsequently, the films are cured to become the insulating resin layers 221 and 231. Further, the wiring layers 225 and 235 of copper including the via conductors 225V and 235V, respectively, are formed by a semi-additive process.

Similarly, the insulating resin layers 241 and 251 and the wiring layers 245 and 255 including the via conductors 245V and 255V, respectively, are formed, followed by formation of the insulating resin layers 261 and 271 serving as solder resist. Thus is completed the printed wiring board 200 (see FIG. 15).

According to the present embodiment, the laminated capacitor C21—which is composed of the metal layers 201 and 203 and the composite dielectric layer 212—is formed on the front surface 211A of the center substrate 211, while the laminated capacitor C22—which is composed of the metal layers 202 and 204 and the composite dielectric layer 213—is formed on the back surface 211B. However, a laminated capacitor may be formed only on either the front or back surface according to circumstances, for example, when a required capacitance is small.

Figure 21:
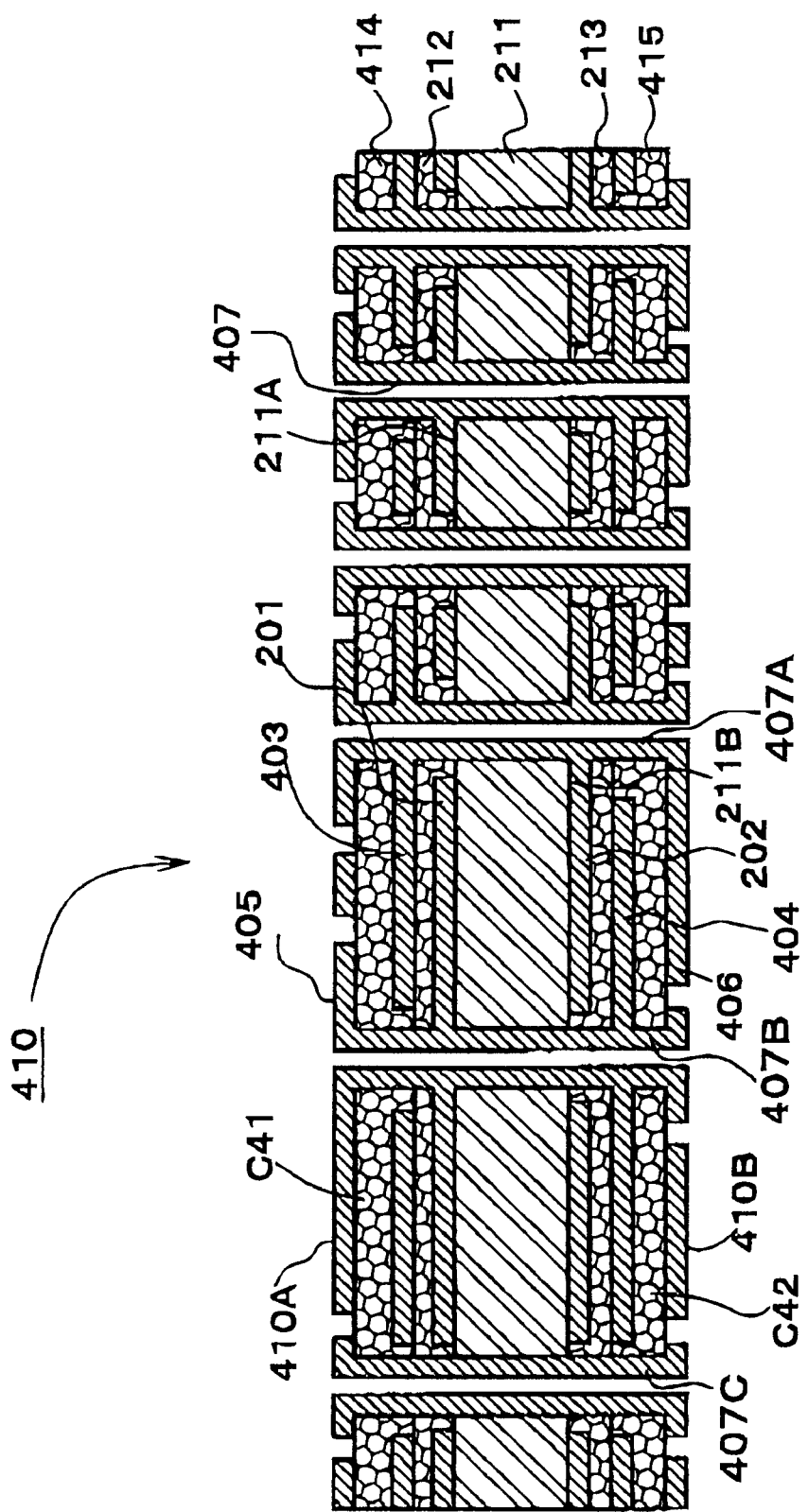
FIG. 21 is a partially enlarged sectional view showing a core substrate according to a modification of the second embodiment.
Figure 22:
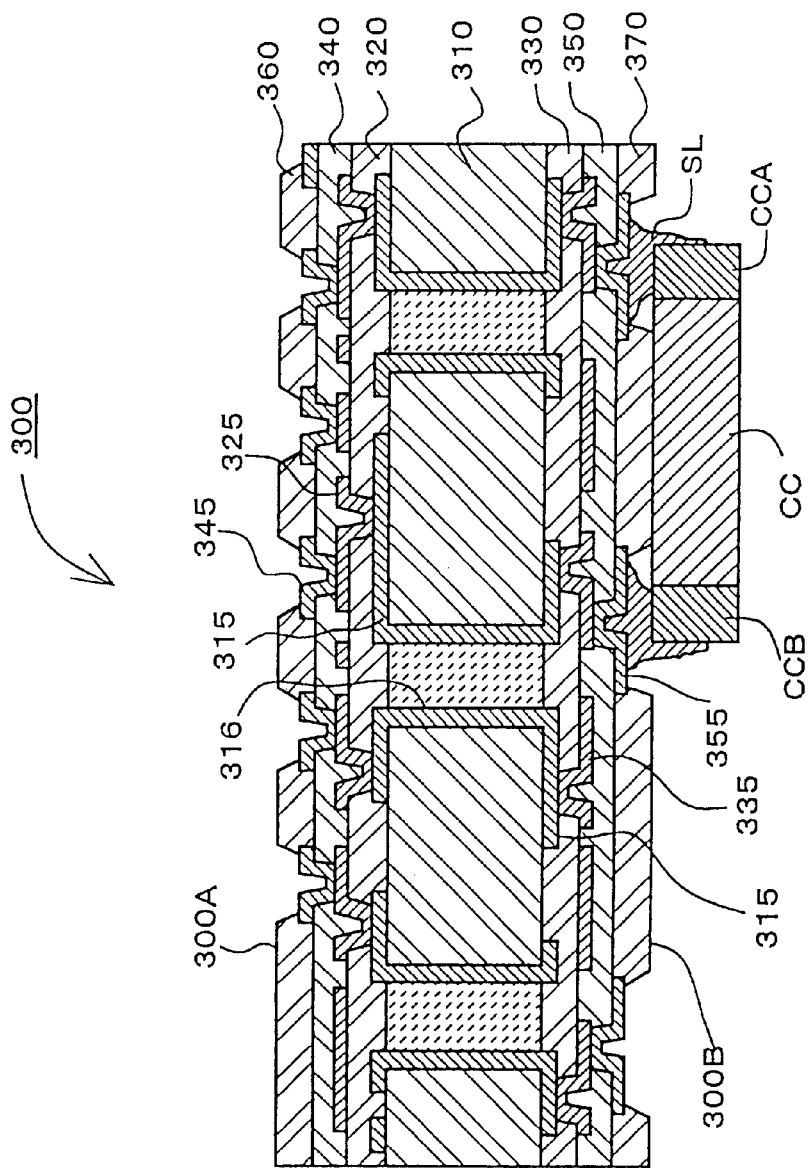
FIG. 22 is a partially enlarged sectional view showing a conventional wiring board having a chip capacitor mounted on a bottom side thereof.

By contrast, when a required capacitance is large, a modification of the second embodiment may be employed. In this modification, the core substrate 210 may be modified such that a laminated capacitor formed on the front and back surfaces of the center substrate includes a plurality of composite dielectric layers and a plurality of metal layers, which are arranged alternately in layers, while some of the metal layers are electrically interconnected by means of through-hole conductors. For example, a core substrate 410 shown in FIG. 21 includes the center substrate 211; a laminated capacitor C41; and a laminated capacitor C42. The laminated capacitor C41 (C42) includes two composite dielectric layers 212 and 414 (213 and 415) and three metal layers 201, 403, and 405 (202, 404, and 406), which are arranged alternatingly in layers. Some of the metal layers are electrically interconnected by means of through-hole conductors 407.

In the core substrate 410, the first through-hole conductor 407A is connected directly to the metal layer 403, which forms one electrode of the front-side laminated capacitor C41, among the metal layers included in the laminated capacitor C41, and is connected directly to the metal layers 202 and 406, which form one electrode of the back-side laminated capacitor C42, among the metal layers included in the laminated capacitor C42. Further, the second through-hole conductor 407B is connected directly to the metal layer 201 and 405, which form the other electrode of the front-side laminated capacitor C41, among the metal layers included in the laminated capacitor C41, and is connected directly to the metal layer 404, which forms the other electrode of the back-side laminated capacitor C42, among the metal layers included in the laminated capacitor C42.

The core substrate 410 is fabricated in the following manner. The three-layer films 10 shown in FIG. 3B and the patterned three-layer films 20 and 30 shown in FIGS. 4B and 4C, respectively, are prepared in advance. Two-layer films obtained through removal of the reinforcement films RF from the patterned three-layer films 20 and 30 are placed on the metal layers 201 and 202, which are formed previously on the front and back surfaces 211A and 211B of the center substrate 211. Sub sequently, on opposite sides of the resultant laminar structure, a two-layer film obtained through removal of the reinforcement film RF from the three-layer film 10 is placed. The laminar structure is then thermally pressed to thereby yield a laminate. The laminate undergoes processing similar to that of the second embodiment, yielding a printed wiring board.

As described above, also in the present embodiment (its modified embodiment), there is no need for sequentially forming the composite dielectric layers 212 and 213 (212, 213, 414, and 415) and the metal layers 201–204 (201, 202, and 403–406). Specifically, through use of the three-layer films 10 and the patterned three-layer films 20 and 30 to make up a required number of layers, a laminate can be formed at a time, thereby facilitating the fabrication of the core substrate 210 (410). When the insulating resin layers and the wiring layers are to be formed on the front and back surfaces 210A and 210B (410A and 410B) of the core substrate 210 (410), the core substrate 210 (410) permits the use of conventional facilities and steps employed for the fabrication of a printed wiring board from a conventional core substrate even though the core substrate 210 (410) has the laminated capacitors C21 and C22 (C41 and C42) incorporated therein. Thus, the printed wiring board 200, for example, can be easily fabricated while the laminated capacitors C21 and C22 are incorporated therein.

Although the embodiments of the present invention have been described above, it will be understood that the invention is not limited thereto and may be changed or modified without departing from the scope of the invention.

For example, the first embodiment has been described while mentioning the core substrate 110 that includes five composite dielectric layers. However, the number of the composite dielectric layers may be modified as adequate according to a required capacitance. An epoxy resin that contains $BaTiO_3$ powder and Cu powder in a dispersed form is used as material for the composite dielectric layers. However, other high-permittivity powder and metal powder may be used.

In the above-described embodiments, the two-layer film 10C and the patterned two-layer films 20C and 30C are superposed directly on one another to thereby form a laminate. However, a adhesive layer may be interposed therebetween through application of a adhesive made of, for example, epoxy resin or through placement of a adhesive film. The resultant laminar structure may be thermally pressed to thereby form a laminate. The thus-obtained laminate enjoys reliable adhesion between the composite dielectric layers and the metal layers.

In another of the above-described embodiments, the three-layer film 10 and the patterned two-layer films 20 and 30 to which reinforcement film RF is bonded are used. However, it should be understood that in some circumstances only the two-layer film 10C and the patterned two-layer films 20C and 30C may be used, without use of the reinforcement film RF.

What is claimed is:

1. A printed wiring board comprising a core substrate having at least one insulating resin layer laminated on each of front and back surfaces of the core substrate, and a wiring layer formed at least between one of (i) the core substrate and the at least one insulating resin layer and (ii), wherein said at least one insulating resin layer comprises a plurality of insulating resin layers, the insulating resin layers, the core substrate comprising:

a plurality of composite dielectric layers each containing resin and a high-permittivity powder and including an uppermost composite layer and a lowermost composite layer;

a plurality of metal layers stacked alternately with the composite dielectric layers such that the metal layers are disposed between the composite dielectric layers as well as on a lower surface of the lowermost composite dielectric layer and on an upper surface of the uppermost composite dielectric layer, so as to sandwich the composite dielectric layers between the metal layers to thereby form a laminated capacitor; and a plurality of through-hole conductors each of which is formed in a though-hole penetrating the plurality of composite dielectric layers and the plurality of metal layers and each of which extends between front and back surfaces of the core substrate, the through-hole conductors including a plurality of first through-hole conductors directly connected to first interior metal layers which comprise first alternate interior metal layers formed between the composite dielectric layers; a plurality of second through-hole conductors directly connected to second interior metal layers which comprise second alternate interior metal layers different from said first alternate interior metal layers; and a plurality of third through-hole conductors unconnected to any of the interior metal layers.

2. A printed wiring substrate according to claim 1, wherein:

among the three types of through-hole conductors, only the first and second through-hole conductors are formed within an area occupied by an IC chip, and the third through-hole conductor is not formed within the area, or the number of the third through-hole conductors formed within the area is smaller than the total number of the first and second through-hole conductors formed within the area; and the number of the third through-hole conductors formed outside the area is greater than the number of the third through-hole conductors formed within the area.

3. A printed wiring board according to claim 1, wherein the resin contained in the composite dielectric layer is selected from the group consisting of epoxy resin, polyimide resin, and BT resin.

4. A printed wiring board according to claim 1, wherein the high-permittivity powder contained in the composite dielectric layer is powder of a material selected from the group consisting of $BaTiO_3$, $PbTiO_3$, $PbZrO_3$, $Pb(Ti,Zr)O_3$, $Pb(Mn,Nb)O_3$, $SrTiO_3$, $CaTiO_3$, and $MgTiO_3$.

5. A printed wiring board according to claim 4, wherein the composite dielectric layer further contains a metal powder selected from the group consisting of Ag, Au, Cu, Ag—Pd, Ni, W, and Mo.

6. A printed wiring board comprising a core substrate having front and back surfaces, at least one insulating resin layer laminated onto the front and back surfaces of the core substrate, and a wiring layer formed at least between the core substrate and the insulating resin layer or between the insulating resin layers, the core substrate comprising:
  a center substrate having front and back surfaces;
  first and second laminated capacitors formed, respectively, on the front and back surfaces of the center substrate, each laminated capacitor comprising at least one composite dielectric layer containing resin and a high-permittivity powder, and a plurality of metal layers stacked alternately with the composite dielectric layers so as to sandwich the composite dielectric layers therebetween; and
  a plurality of through-hole conductors each formed in a through-hole extending through the first laminated capacitor, the center substrate, and the second laminated capacitor, the through-holes conductors extending between the front and back surfaces of the core substrate and including first, second and third through-hole conductors, the first through-hole conductors being directly connected to at least one metal layer of the plurality of metal layers of the first laminated capacitor and serving as a first electrode of the first laminated capacitor, and to at least one layer of the plurality of metal layers of the second laminated capacitor and serving as a first electrode of the second laminated capacitor, the second through-hole conductor being directly connected to at least one metal layer of the plurality of metal layers of the first side laminated capacitor and serving as a second electrode of the first laminated capacitor, and to at least one metal layer of the plurality of metal layers of the second laminated capacitor and serving as a second electrode of the second laminate capacitor, and the third through-hole conductor being unconnected to any of the electrodes of the first and second laminated capacitors.

7. A printed wiring board according to claim 6, wherein among the three types of through-hole conductors, only the first and second through-hole conductors are formed within an area occupied by an IC chip, and the third through-hole conductors is not formed within the area, or the number of the third through-hole conductors formed within the area is smaller than the total number of the first and second through-hole conductors formed within the area; and the number of the third through-hole conductors formed outside the area is greater than the number of the third through-hole conductors formed within the area.

8. A core substrate according to claim 6, wherein the resin contained in the composite dielectric layer is selected from the group consisting of epoxy resin, polyimide resin, and BT resin.

9. A core substrate according to claim 6, wherein the high-permittivity powder contained in the composite dielectric layer is powder of a material selected from the group consisting of $BaTiO_3$, $PbTiO_3$, $PbZrO_3$, $Pb(Ti,Zr)O_3$, $Pb(Mn,Nb)O_3$, $SrTiO_3$, $CaTiO_3$, and $MgTiO_3$.

10. A core substrate according to claim 9, wherein the composite dielectric layer further contains a metal powder selected from the group consisting of Ag, Au, Cu, Ag—Pd, Ni, W, and Mo.

11. A core substrate which is used to fabricate a printed wiring board through lamination of at least one insulating resin layer and wiring layer on each of front and back surfaces of the core substrate, the core substrate comprising:
  a plurality of composite dielectric layers each containing resin and a high-permittivity powder and including an uppermost composite layer and a lowermost composite layer;
  a plurality of metal layers stacked alternately with the composite dielectric layers such that the metal layers are disposed between the composite dielectric layers, as well as on a lower surface of the lowermost composite dielectric layer, and on an upper surface of the uppermost composite dielectric layer, so as to sandwich the composite dielectric layers between the metal layers to thereby form a laminated capacitor; and
  a plurality of through-holes conductors each of which is formed in a through-hole penetrating the plurality of composite dielectric layers and the plurality of metal layers and each of which extends between the front and back surfaces of the core substrate, the through-hole conductors including a first through-hole conductor directly connected to first interior metal layers which comprise alternate interior metal layers formed between the composite dielectric layers; a second through-hole conductor directly connected to second interior metal layers which comprise second alternate interior metal layers and which are not connected to the first through-hole conductors; and a third through-hole conductor unconnected to any of the interior metal layers.

12. A core substrate according to claim 11, wherein
  among the three types of through-hole conductors, only the first and second through-hole conductors are formed within a center portion of the core substrate as viewed in a plan view, and the third through-hole conductor is not formed within the center portion, or the number of the third through-hole conductors formed within the center portion is smaller than the total number of the first and second through-hole conductors formed within the center portion; and
  the number of the third through-hole conductors formed outside the center portion is greater than the number of the third through-hole conductors formed within the center portion.

13. A core substrate according to claim 11, wherein the resin contained in the composite dielectric layer is selected from the group consisting of epoxy resin, polyamide resin, and BT resin.

14. A core substrate according to claim 11, wherein the high-permittivity powder contained in the composite dielectric layer is powder of a material selected from the group consisting of $BaTiO_3$, $PbTiO_3$, $PbZrO_3$, $Pb(Ti, Zr)O_3$, $Pn(Mn, Nb)O_3$, $SrTiO_3$, $CaTiO_3$, and $MgTiO_3$.

15. A core substrate according to claim 14, wherein the composite dielectric layer further contains a metal powder selected from the group consisting of Ag, Au, Cu, Ag—Pd, Ni, W, and Mo.

16. A core substrate for use in fabricating a printed wiring board through lamination of at least one insulating resin layer and wiring layer on each of front and back surfaces of the core substrate, the core substrate comprising:

a center substrate having front and back surfaces;

first and second capacitor formed, respectively, on the front and back surfaces of the center substrate, each laminated capacitor comprising at least one composite dielectric layer containing resin and a high-permittivity powder, and a plurality of metal layers stacked alternately with the composite dielectric layers so as to sandwich the composite dielectric layers therebetween; and a plurality of through-hole conductors each formed in a through-hole extending through the first laminated capacitor, the center substrate, and the second laminated capacitor, the through-hole conductors extending between the front and back surfaces of the core substrate and including first, second and third through-hole conductors, the first through-hole conductor being directly connected to at least one metal layer of the plurality of metal layers of the first laminated capacitor and serving as a first electrode of the first laminated capacitor, as well as to at least one metal layer of the plurality of metal layers of the second laminated capacitor and serving as a first electrode of the second laminated capacitor, the second through-hole conductor being directly connected to at least one metal layer of the plurality of metal layers of the first laminated capacitor and serving as a second electrode of the first laminated capacitor, as well as to at least one metal layer of the plurality of metal layers of the second laminated capacitor and serving as a second electrode of the second laminated capacitor, and the third through-hole conductor being unconnected to any of the electrodes of the first and second laminated capacitors.

17. A core substrate according to claim 16, wherein among the three types of through-hole conductors, only the first and second through-hole conductors are formed within a center portion of the core substrate as viewed in a plan view, and the third through-hole conductor is not formed within the center portion, or the number of the third through-hole conductors formed within the center portion is smaller than the total number of the first and second through-hole conductors formed within the center portion; and the number of the third through-hole conductors formed outside the center portion is preferably greater than the number of the third through-hole conductors formed within the center portion.

18. A core substrate according to claim 16, wherein the resin contained in the composite dielectric layer is selected from the group consisting of epoxy resin, polyimide resin, and BT resin.

19. A core substrate according to claim 16, wherein the high-permittivity powder contained in the composite dielectric layer is powder of a material selected from the group consisting of $BaTiO_3$, $PbTiO_3$, $PbZrO_3$, $Pb(Ti,Zr)O_3$, $Pb(Mn,Nb)O_3$, $SrTiO_3$, $CaTiO_3$, and $MgTiO_3$.

20. A core substrate according to claim 18, wherein the composite dielectric layer further contains a metal powder selected from the group consisting of Ag, Au, Cu, Ag—Pd, Ni, W, and Mo.

* * * * *